(12) United States Patent
Goto et al.

(10) Patent No.: US 8,482,189 B2
(45) Date of Patent: Jul. 9, 2013

(54) DISPLAY DEVICE

(75) Inventors: Hiroshi Goto, Kobe (JP); Aya Miki, Kobe (JP); Katsufumi Tomihisa, Kobe (JP); Mototaka Ochi, Kobe (JP); Takashi Onishi, Kobe (JP); Toshihiro Kugimiya, Kobe (JP)

(73) Assignee: Kobe Steel, Ltd., Kobe-shi (JP)

(*) Notice: Subject to any disclaimer, the term of this patent is extended or adjusted under 35 U.S.C. 154(b) by 0 days.

(21) Appl. No.: 13/144,716

(22) PCT Filed: Jan. 15, 2010

(86) PCT No.: PCT/JP2010/050437
§ 371 (c)(1),
(2), (4) Date: Jul. 15, 2011

(87) PCT Pub. No.: WO2010/082637
PCT Pub. Date: Jul. 22, 2010

(65) Prior Publication Data
US 2011/0273075 A1    Nov. 10, 2011

(30) Foreign Application Priority Data

Jan. 16, 2009  (JP) ................................. 2009-008264
Jul. 27, 2009  (JP) ................................. 2009-174690
Dec. 8, 2009   (JP) ................................. 2009-278377

(51) Int. Cl.
*H01L 51/00* (2006.01)
(52) U.S. Cl.
USPC ........................................ 313/311; 313/503
(58) Field of Classification Search
USPC .................................................. 313/498–512
See application file for complete search history.

(56) References Cited

U.S. PATENT DOCUMENTS

| 5,514,909 A | 5/1996 | Yamamoto et al. |
| 6,033,542 A | 3/2000 | Yamamoto et al. |
| 6,096,438 A | 8/2000 | Takagi et al. |
| 6,218,206 B1 | 4/2001 | Inoue et al. |

(Continued)

FOREIGN PATENT DOCUMENTS

| JP | 7 66423 | 3/1995 |
| JP | 8 8498 | 1/1996 |

(Continued)

OTHER PUBLICATIONS

U.S. Appl. No. 13/254,316, filed Sep. 1, 2011, Kobayashi, et al.

(Continued)

*Primary Examiner* — Anne Hines
(74) *Attorney, Agent, or Firm* — Oblon, Spivak, McClelland, Maier & Neustadt, L.L.P.

(57) ABSTRACT

A display device is provided with a Cu alloy film having high adhesiveness to a transparent substrate and a low electrical resistivity. The Cu alloy film for the display device is directly brought into contact with the transparent substrate, and the Cu alloy film has the multilayer structure, which includes a first layer (Y) composed of a Cu alloy containing, in total, 2-20 atm % of at least one element selected from among a group composed of Zn, Ni, Ti, Al, Mg, Ca, W, Nb, and Mn, and a second layer (X) which is composed of pure Cu or substantially a Cu alloy having Cu as the main component and has an electrical resistivity lower than that of the first layer (Y). The first layer (Y) is brought into contact with the transparent substrate.

13 Claims, 13 Drawing Sheets

U.S. PATENT DOCUMENTS

| | | |
|---|---|---|
| 6,219,125 B1 | 4/2001 | Ishikura et al. |
| 6,252,247 B1 | 6/2001 | Sakata et al. |
| 7,098,539 B2 | 8/2006 | Gotoh et al. |
| 7,154,180 B2 | 12/2006 | Gotoh et al. |
| 7,262,085 B2 | 8/2007 | Gotoh et al. |
| 7,365,810 B2 | 4/2008 | Gotoh et al. |
| 7,411,298 B2 | 8/2008 | Kawakami et al. |
| 7,553,754 B2 | 6/2009 | Gotoh et al. |
| 7,622,809 B2 | 11/2009 | Gotoh et al. |
| 7,683,370 B2 | 3/2010 | Kugimiya et al. |
| 7,781,767 B2 | 8/2010 | Kawakami et al. |
| 7,803,238 B2 | 9/2010 | Kugimiya et al. |
| 7,943,933 B2 | 5/2011 | Hino et al. |
| 2003/0047812 A1 | 3/2003 | Hagihara et al. |
| 2006/0091792 A1 | 5/2006 | Kugimiya et al. |
| 2006/0275618 A1 | 12/2006 | Kugimiya et al. |
| 2008/0081532 A1 | 4/2008 | Okuno |
| 2008/0121522 A1 | 5/2008 | Ehira et al. |
| 2008/0223718 A1 | 9/2008 | Takagi et al. |
| 2008/0278649 A1* | 11/2008 | Koike et al. ............ 349/42 |
| 2009/0001373 A1 | 1/2009 | Ochi et al. |
| 2009/0004490 A1 | 1/2009 | Gotou et al. |
| 2009/0011261 A1 | 1/2009 | Gotou |
| 2009/0026072 A1 | 1/2009 | Takagi et al. |
| 2009/0133784 A1 | 5/2009 | Kugimiya et al. |
| 2009/0173945 A1 | 7/2009 | Takasawa et al. |
| 2009/0176113 A1 | 7/2009 | Gotoh et al. |
| 2009/0242394 A1 | 10/2009 | Takagi et al. |
| 2009/0303406 A1* | 12/2009 | Takasawa et al. ............ 349/39 |
| 2010/0012935 A1 | 1/2010 | Hino et al. |
| 2010/0032186 A1 | 2/2010 | Gotou et al. |
| 2010/0065847 A1 | 3/2010 | Gotou et al. |
| 2010/0163877 A1 | 7/2010 | Hino et al. |
| 2010/0207121 A1 | 8/2010 | Hino et al. |
| 2010/0231116 A1 | 9/2010 | Ochi et al. |
| 2010/0328247 A1 | 12/2010 | Miki et al. |
| 2011/0008640 A1 | 1/2011 | Goto et al. |
| 2011/0019350 A1 | 1/2011 | Nakai et al. |
| 2011/0024761 A1 | 2/2011 | Kawakami et al. |
| 2011/0121297 A1 | 5/2011 | Kawakami et al. |
| 2011/0147753 A1 | 6/2011 | Onishi et al. |

FOREIGN PATENT DOCUMENTS

| | | |
|---|---|---|
| JP | 8 138461 | 5/1996 |
| JP | 10 133597 | 5/1998 |
| JP | 10 186389 | 7/1998 |
| JP | 11 283934 | 10/1999 |
| JP | 11 284195 | 10/1999 |
| JP | 11 337976 | 12/1999 |
| JP | 2003 273109 | 9/2003 |
| JP | 2005 158887 | 6/2005 |
| JP | 2005 166757 | 6/2005 |
| WO | 2008 018490 | 2/2008 |
| WO | 2008 081806 | 7/2008 |

OTHER PUBLICATIONS

U.S. Appl. No. 13/320,673, filed Nov. 15, 2011, Tanifuji, et al.
U.S. Appl. No. 13/387,522, filed Jan. 27, 2012, Goto, et al.
U.S. Appl. No. 13/387,557, filed Jan. 27, 2012, Maeda, et al.
International Search Report issued Apr. 13, 2010 in PCT/JP10/50437 filed Jan. 15, 2010.
Japanese Office Action issued Apr. 13, 2010 in JP 2009-278377 filed Dec. 8, 2009 (with English translation).
U.S. Appl. No. 13/122,937, filed Apr. 6, 2011, Nanbu, et al.
U.S. Appl. No. 13/126,126, filed Jun. 29, 2011, Ochi, et al.
U.S. Appl. No. 13/581,436, filed Aug. 27, 2012, Iwasaki, et al.
U.S. Appl. No. 13/810,949, filed Jan. 18, 2013, Miki, et al.

* cited by examiner

FIG.16
(a) DEPTH PROFILE OF Cu-4Mn(300nm)
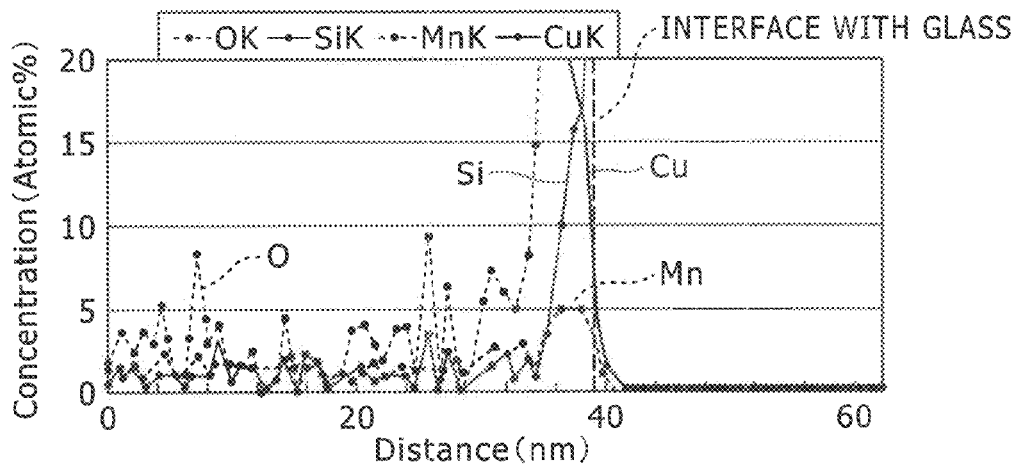
(b) DEPTH PROFILE OF Cu/Cu-4Mn(500/50nm)
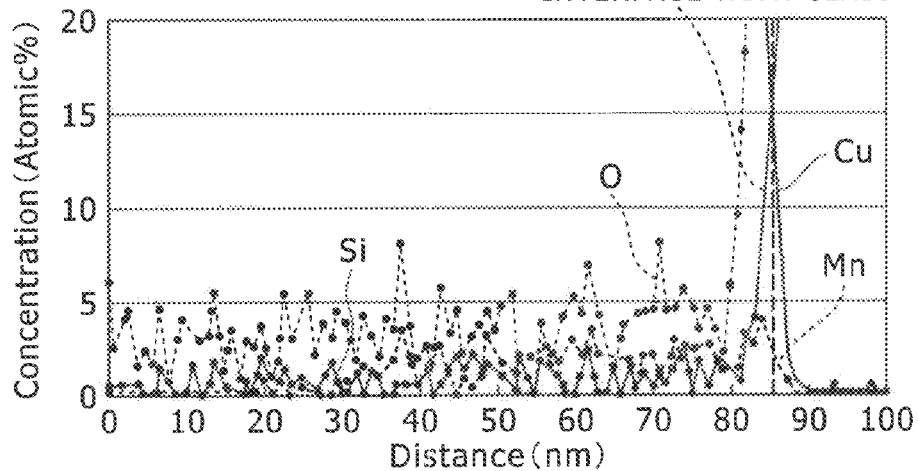
(c) DEPTH PROFILE OF Cu/Cu-4Mn(500/20nm)
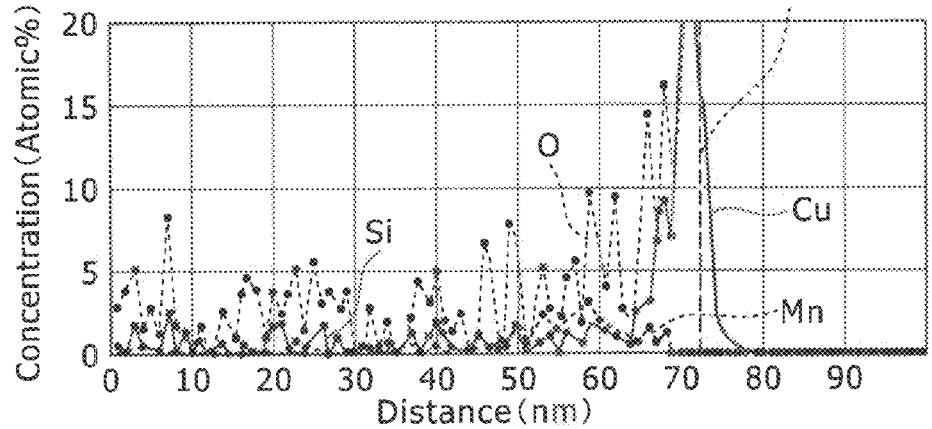

DISPLAY DEVICE

TECHNICAL FIELD

The present invention relates to a display device with a Cu alloy film that is used in a display device, such as a liquid crystal display or organic electroluminescence display, and in particular, to a display device with a Cu alloy film excellent in the adhesiveness to a transparent substrate, such as a glass substrate.

BACKGROUND ART

Conventionally, aluminum (Al) alloy films have been used in the wiring of the display devices represented by liquid crystal displays. However, with the growth in size and the high definition of the display devices, problems resulting from a fact that a wiring resistance is large, such as signal delay and electrical power loss, are coming to the surface. Accordingly, copper (Cu) having a resistance lower than that of Al attracts attention as a wiring material. The electrical resistivity of Cu is as low as $1.6 \times 10^{-6}$ Ω*cm, whereas that of Al is $2.5 \times 10^{-6}$ Ω*cm.

However, Cu has the problem that the adhesiveness thereof to a glass substrate is low, and may be peeled off. In particular, in the case of a soda-lime glass substrate (glass substrate comprising silicic acid, soda ash, and lime as the main materials) that is inexpensive and capable of being processed to have a large area, peel off of a wiring material, occurring due to the migration of alkali metal elements contained in the glass substrate, such as Na, becomes a problem. Also, there is the problem that, because the adhesiveness of Cu to a glass substrate is low, it is difficult to perform wet etching for processing Cu into a wiring shape. Therefore, various techniques for enhancing the adhesiveness between Cu and a glass substrate are proposed.

For example, Patent Documents 1 to 3 disclose techniques in each of which the adhesiveness is intended to be enhanced by interposing a layer composed of a metal having high melting temperature, such as molybdenum (Mo) or chromium (Cr), between Cu wiring and a glass substrate. In these techniques, however, a process for forming the layer composed of a metal having high meting temperature becomes further necessary, and accordingly the manufacturing cost of a display device is increased. In addition, because dissimilar metals of Cu and a metal (Mo, or the like) having high melting temperature are laminated one on another, there is the fear that corrosion may occur on the interface between Cu and the metal having high melting temperature when wet etching is performed. Further, because there is a difference in the etching rate between the dissimilar metals, the problem that the wiring section cannot be formed into a desired shape (e.g., a shape having a taper angle of approximately 45 to 60°) may arise. Furthermore, because the electrical resistivity of a metal having high melting temperature, for example, that of Cr ($12.9 \times 10^{-6}$ Ω*cm), is higher than that of Cu, and accordingly a signal delay or electrical power loss, occurring due to the wiring resistance, becomes a problem.

Patent Document 4 discloses a technique in which nickel or a nickel alloy, and a polymer resin film are interposed as an adhesive layer between Cu wiring and a glass substrate. In the technique, however, the resin film is deteriorated in the high-temperature annealing process during the manufacture of a display device (e.g., liquid crystal panel), and accordingly there is the fear that the adhesiveness thereof may be decreased.

Patent Document 5 discloses a technique in which copper nitride is interposed as an adhesive layer between Cu wiring and a glass substrate. However, copper nitride itself is not a stable compound. Accordingly, in the technique, N atoms are released as $N_2$ gas in the high-temperature annealing process during the manufacture of a display device (e.g., liquid crystal panel), resulting in the deterioration of the wiring film, and accordingly there is the fear that the adhesiveness thereof may be decreased.

PRIOR ART DOCUMENTS

Patent Documents

[Patent Document 1] Japanese Patent Application Publication No. H7-66423
[Patent Document 2] Japanese Patent Application Publication No. H8-8498
[Patent Document 3] Japanese Patent Application Publication No. H8-138461
[Patent Document 4] Japanese Patent Application Publication No. H10-186389
[Patent Document 5] Japanese Patent Application Publication No. H10-133597

DISCLOSURE OF THE INVENTION

Problem to be Solved by the Invention

The present invention has been made in view of the aforementioned situations, and an object of the invention is to provide a display device with a Cu alloy film having high adhesiveness to a transparent substrate and a low electrical resistivity.

Means for Solving the Problem

The present invention relates to the following display devices (1) to (7).

(1) A display device having a Cu alloy film for the display device that is formed on a transparent substrate and is directly brought into contact with the transparent substrate, in which the Cu alloy film has the multilayer structure, which includes a first layer (Y) composed of a Cu alloy containing, in total, 2-20 atom % of at least one element selected from the group consisting of Zn, Ni, Ti, Al, Mg, Ca, W, Nb, and Mn, and a second layer (X) that is composed of pure Cu or substantially a Cu alloy having Cu as the main component and has an electrical resistivity lower than that of the first layer (Y), and in which the first layer (Y) is brought into contact with the transparent substrate.

(2) The display device according to (1), in which the thickness of the first layer (Y) is more than or equal to 10 nm and less than or equal to 100 nm, and is less than or equal to 60% based on the total thickness of the Cu alloy film.

(3) The display device according to (1) or (2), in which the first layer (Y) contains at least Mn and the thickness of the first layer (Y) is more than or equal to 10 nm and less than or equal to 100 nm.

(4) The display device according to (1) or (2), in which the first layer (Y) contains at least Zn or Ni and the thickness of the first layer (Y) is more than or equal to 20 nm and less than or equal to 100 nm.

(5) The display device according to any one of (1) to (4), in which the first layer (Y) contains at least Mn and the thickness $T_M$ (nm) of the first layer (Y) and the content M (atom %) of Mn satisfy the relationship of $T_M \geq 230 \, M^{-1.2}$.

(6) The display device according to any one of (1) to (5), in which the Cu alloy film is subjected to a heat treatment at 250° C. or higher for 5 minutes or longer.

(7) The display device according to any one of (1) to (6), in which the material of the transparent substrate is soda-lime glass.

Advantage of the Invention

A display device according to the present invention is provided with a Cu alloy film (wiring film) having the multilayer structure, which includes a first layer (Y) composed of a Cu alloy containing predetermined elements excellent in the adhesiveness to a transparent substrate and a second layer (X) composed of pure Cu or a Cu alloy having an electrical resistivity lower than that of the first layer (Y), and hence both the high adhesiveness to the transparent substrate and a low electrical resistivity as the whole Cu alloy film can be achieved. With respect to the adhesiveness, still better adhesiveness can be achieved by appropriately controlling the thickness of the first layer (Y) and the content of Mn in the first layer (Y), in addition to the fact that the alloy element in the first layer (Y) is particularly made to be Mn. Further, in particular, the Cu alloy film employed in the present invention is extremely excellent in the resistance for the migration of sodium ion, etc., (migration resistance), which may occur when an inexpensive soda-lime glass substrate is used, and hence the Cu alloy film can be used in an extremely suitable manner as a wiring material for the display device provided with a soda-lime glass substrate. Furthermore, the Cu alloy film employed in the invention has the multilayer structure including similar pure Cu or Cu alloys, which does not cause an extreme difference in the etching rate between them, and hence fine-processing excellent in forming a shape, by which a pattern can be easily formed, can be performed by using the aforementioned Cu alloy film.

BRIEF DESCRIPTION OF THE DRAWINGS

FIG. 16(a) is a graph illustrating the concentration profile near the interface between the first layer (Y) and the glass substrate when the first layer (Y) is composed of Cu-4Mn, the thickness thereof is 300 nm, and a second layer (X) is not present;

FIG. 16(b) is a graph illustrating the concentration profile near the interface between the first layer (Y) and the glass substrate when the first layer (Y) is composed of Cu-4Mn, the thickness thereof is 50 nm, the second layer (X) is composed of pure Cu, and the thickness thereof is 500 nm (a heat treatment is performed at 320° C. for 5 minutes);

FIG. 16(c) is a graph illustrating the concentration profile near the interface between the first layer (Y) and the glass substrate when the first layer (Y) is composed of Cu-4Mn, the thickness thereof is 20 nm, the second layer (X) is composed of pure Cu, and the thickness thereof is 500 nm (a heat treatment is performed at 320° C. and for 5 minutes);

BEST MODE FOR CARRYING OUT THE INVENTION

Figure 1:
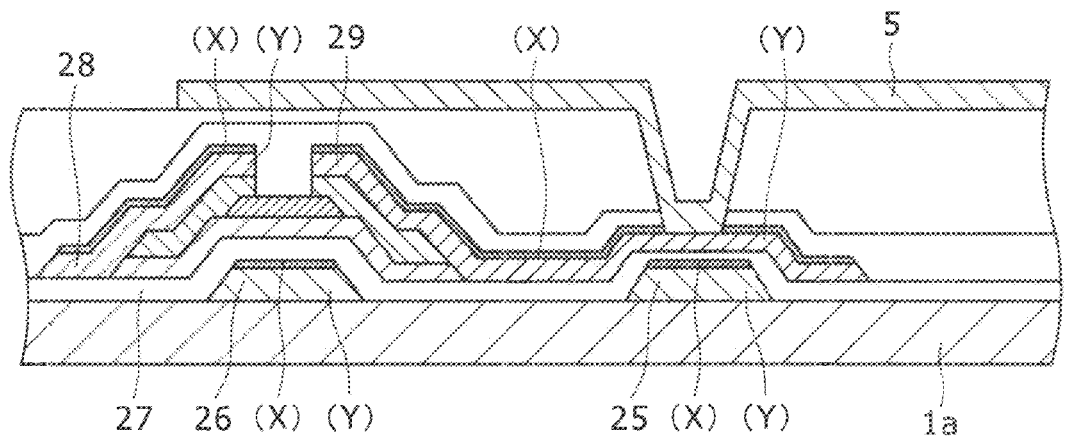
FIG. 1 is a sectional view illustrating the structure of a thin film transistor (TFT) according to an example of the present invention.

A display device according to the present invention is one having, on a transparent substrate, a Cu alloy film for the display device that is directly brought into contact with the transparent substrate, in which the Cu alloy film has the multilayer structure, which includes a first layer (Y) composed of a Cu alloy containing, in total, 2-20 atom % of at least one element selected from the group consisting of Zn, Ni, Ti, Al, Mg, Ca, W, Nb, and Mn, and a second layer (X) composed of pure Cu or a Cu alloy having an electrical resistivity lower than that of the first layer (Y), and in which the first layer (Y) is brought into contact with the transparent substrate.

In the present invention, the first layer (Y) brought into direct contact with the transparent substrate is composed of a Cu alloy containing alloy elements contributing to the enhancement of the adhesiveness, thereby allowing for the adhesiveness to the transparent substrate to be enhanced. On the other hand, the second layer (X) laminated on the first layer (Y) is composed of an element having a low electrical resistivity (pure Cu or a Cu alloy having a low electrical resistivity similar to that of pure Cu), thereby intending to reduce the electrical resistivity of the whole Cu alloy film. That is, by making the Cu alloy film have the aforementioned multilayer structure specified in the invention, the intrinsic characteristic of Cu that the electrical resistivity is low in comparison with Al is effectively exerted to a maximum extent, and in addition to that, the low adhesiveness to a transparent substrate, which has been a defect of Cu, can be resolved.

In the present invention, the "Cu alloy having an electrical resistivity lower than that of the first layer (Y)", the Cu alloy forming the second layer (X), can be made by appropriately controlling the type and/or the content of the alloy element such that the electrical resistivity thereof is lower than that of the first layer (Y) composed of an Cu alloy containing an adhesiveness-enhancing element. An element having a low electrical resistivity (element having a low electrical resistivity approximately the same to that of pure Cu alloy) can be easily selected from known elements with reference to the values described in documents, etc. However, even in the case of an element having a high electrical resistivity, the electrical resistivity thereof can be reduced by reducing the content thereof (reducing to approximately 0.05 to 1 atom %), and hence the aforementioned alloy element applicable to the second layer (X) is not necessarily limited to the elements having a low electrical resistivity. Specifically, for example, Cu-0.5 atom % Ni, Cu-0.5 atom % Zn, Cu-0.3 atom % Mn, and the like, can be preferably used. In addition, the aforementioned alloy elements applicable to the second layer (X) may contain a gas component of oxygen gas and nitrogen gas, and for example, Cu—O and Cu—N, etc., can be used.

The Cu alloy having an electrical resistivity lower than that of the first layer (Y) contains the applicable elements with the balance being Cu and unavoidable impurities.

Hereinafter, the first layer (Y) by which the present invention is most characterized will be described in detail.

Regarding First Layer (Y)

In the aforementioned Cu alloy film, the first layer (Y) is directly brought into contact with the transparent substrate, and is composed of a Cu alloy containing, in total, 2-20 atom % of at least one element (adhesiveness-enhancing element) selected from the group consisting of Zn, Ni, Ti, Al, Mg, Ca, W, Nb, and Mn. These elements may be contained alone or in combination of two or more thereof. When a single element is contained, the amount of the single element may be within the aforementioned range, and when two or more elements are contained, the total amount thereof may be within the aforementioned range. These elements are selected as the element that is solid-dissolved in a Cu metal but not solid-dissolved in a Cu oxide film. It can be considered that, when a Cu alloy in which these elements are solid-dissolved is oxidized by a heat treatment performed during the film formation, the aforementioned elements migrate and then are concentrated in the grain boundaries and on the interface, thereby allowing for the adhesiveness to a transparent substrate to be enhanced by the concentrated layer. With the formation of such a concentrated layer, sufficient adhesiveness can be secured even when the Cu alloy film is directly connected to the transparent substrate without interposing a barrier metal. As a result, deterioration of the display performance, such as gradation display of a liquid crystal display, can be prevented.

Of the aforementioned adhesiveness-enhancing elements, Mn and Ni are preferably used, and Mn is more preferably used. It is because Mn is an element in which the aforementioned concentration phenomenon occurring on the interface is expressed very strongly. That is, Mn migrates from the inside of the film toward the outside thereof (toward the interface with the transparent substrate) by a heat treatment performed during the formation of the Cu alloy film or after the formation thereof (including a heat history in the process of manufacturing a display device, for example, such as a process of manufacturing an insulating film of SiN film). The migration of Mn toward the interface is further accelerated with an Mn oxide, which is generated by the oxidation due to the heat treatment, being a driving force. It can be considered that, as a result of that, a Cu—Mn reaction layer (hereinafter, referred to as an "Mn reaction layer") is formed on the interface with the substrate, thereby allowing for the adhesiveness to the substrate to be enhanced remarkably (see the later-described photograph of FIG. 15).

Such an Mn reaction layer is preferably obtained by performing a heat treatment at approximately 250° or higher for 5 minutes or longer after a Cu alloy film has been formed by a sputtering method, which will be described in detail later. It is because an alloy element is likely to migrate to the interface and be concentrated there by such a heat treatment.

The aforementioned heat treatment may be performed for the purpose of forming the aforementioned concentrated film, such as an Mn reaction layer, or may be substituted by a heat history after the formation of the Cu alloy film (for example, the process for forming a protective film, such as an SiN film), which satisfies the above temperature and period of time.

The content of the aforementioned elements is made to be more than or equal to 2 atom %. If the content thereof is less than 2 atom %, the adhesiveness to the transparent substrate becomes insufficient, and accordingly satisfactory characteristics cannot be obtained. Although it is described in the later examples, if the content thereof is, for example, as small as approximately 0.5%, there are sometimes the cases where good adhesiveness is obtained on certain conditions; however, it lacks reproducibility. Accordingly, in the present invention, the lower limit of the content of the aforementioned elements is made to be more than or equal to 2 atom % in view of also reproducibility. Thereby, good adhesiveness can always be obtained irrespective of measurement conditions, etc. On the other hand, if the content of the aforementioned elements is more than 20 atom %, the electrical resistivity of the Cu alloy film (wiring film) itself (first layer+ second layer) becomes large and a residue is generated during the etching of wiring, and hence it becomes difficult to perform fine-processing. As stated above, the lower limit of the content thereof is preferably 3 atom %, and more preferably 4 atom % from the viewpoint of adhesiveness. Further, the upper limit of the content thereof is preferably 12 atom %, more preferably 10 atom %, still more preferably 8.0 atom %, and even still more preferably 4.0 atom % (in particular, 3.5 atom %) from the viewpoint of electrical resistivity, etc.

Strictly speaking, the preferred content of the aforementioned elements can change in accordance with the types of the elements. It is because a load (influence) on the adhesiveness and electrical resistance changes in accordance with the types of the elements. For example, it is preferable that the content of Mn is more than or equal to 3 atom % and less than or equal to 12 atom %, and it is more preferable that the content thereof is more than or equal to 4 atom % and less than or equal to 10 atom %. In addition, it is preferable that the content of Zn is more than or equal to 2 atom % and less than or equal to 10 atom %.

The Cu alloy of which the first layer (Y) is composed contains the aforementioned elements with the balance being Cu and unavoidable impurities.

The Cu alloy of which the first layer (Y) is composed may further contain, in total (when a single element is used, in an amount of the single element), 0.02 to 1.0 atom % of Fe and/or Co, thereby allowing for the low electrical resistivity and the high adhesiveness to the transparent substrate to be further enhanced. The content thereof is preferably more than or equal to 0.05 atom % and less than or equal to 0.8 atom %, and more preferably more than or equal to 0.1 atom % and less than or equal to 0.5 atom %.

In the aforementioned Cu alloy film, the second layer (X) is formed (directly) on the first layer (Y), and is composed of pure Cu or a Cu alloy that has Cu as the main component and has an electrical resistivity lower than that of the first layer (Y). The electrical resistivity of the whole Cu alloy film can be suppressed to a low level by providing such the second layer (X).

The expression of "has Cu as the main component" means that, of the elements of which a material is composed, the mass or the number of atoms of Cu is largest, and it is preferable that the content of Cu is substantially more than or equal to 90 atom % from the viewpoint of electrical resistivity.

Although, it is made that the Cu alloy film employed in the present invention exerts desired characteristics by making the Cu alloy film have the multilayer structure including the second layer (X) and the first layer (Y), the compositions of which are different from each other, it is particularly effective to control the thickness of the first layer (Y) in order to exert these characteristics more effectively. Specifically, it is preferable that the thickness of the first layer (Y) is more than or equal to 10 nm and less than or equal to 60% based on the total thickness of the Cu alloy film [thickness of the second layer (X)+the first layer (Y)]. Thereby, low electrical resistivity and high adhesiveness can be obtained, and in addition to that, the property for fine-processing can be exerted more effectively. It is more preferable that the thickness of the first layer (Y) is more than or equal to 20 nm and less than or equal to 50% based on the total thickness of the Cu alloy film.

It is better to appropriately determine the upper limit of the thickness of the first layer (Y) mostly in view of the electrical resistivity of the wiring film itself, and the upper limit thereof is preferably less than or equal to 100 nm, and more preferably less than or equal to 80 nm. Although the lower limit of the ratio of the thickness of the first layer (Y) to the total thickness of the Cu alloy film is not particularly limited, it is preferable that the ratio thereof is approximately 15% in view of the enhancement of the adhesiveness to the transparent substrate.

Strictly speaking, the thickness of the aforementioned first layer (Y) can change in accordance with the types of the elements contained in the first layer (Y). It is because an influence on the adhesiveness and electrical resistance changes in accordance with the types of the elements. For example, when the first layer (Y) contains at least Mn, the lower limit of the thickness of the first layer (Y) is preferably more than or equal to 10 nm, and more preferably more than or equal to 20 nm. In the case of Mn, the upper limit of the thickness thereof is preferably less than or equal to 100 nm, more preferably less than or equal to 80 nm, and still more preferably less than or equal to 50 nm. When the first layer (Y) contains at least Ni or Zn, the lower limit thereof is preferably more than or equal to 20 nm, and more preferably more than or equal to 30 nm, and the upper limit thereof is preferably less than or equal to 100 nm, and more preferably less than or equal to 80 nm.

When the first layer (Y) contains at least both Mn and Ni or Zn, the lower limit of the thickness thereof is preferably more than or equal to 10 nm, and more preferably more than or equal to 20 nm, and the upper limit thereof is preferably less than or equal to 100 nm, and more preferably less than or equal to 80 nm.

The total thickness of the Cu alloy film (the second layer (X)+the first layer (Y)) is preferably more than or equal to approximately 200 nm and less than or equal to approximately 500 nm, and more preferably more than or equal to approximately 250 nm and less than or equal to approximately 400 nm.

Regarding the adhesiveness, in order to effectively exert the effect of enhancing the adhesiveness to the transparent substrate by the formation of the aforementioned first layer (Y), it is preferable to control the content of the aforementioned adhesiveness-enhancing elements and the thickness of the first layer (Y) with the two being associated with each other, not by separately controlling them. It is because, according to the experimental results by the present inventors, it has been learned that the adhesives to the substrate is closely associated with the total amount of the adhesiveness-enhancing elements present in the first layer (Y). Specifically, it is preferable to control the two as follows: for example, when the content of the aforementioned elements is small, the thickness of the first layer (Y) is made large, on the other hand, when the thickness of the first layer (Y) is small, the content of the aforementioned elements is made large.

Specifically, for example, when Mn is used as an adhesiveness-enhancing element, it is preferable that the thickness $T_M$ (nm) of the first layer (Y) and the content M (atom %) of Mn satisfy the relationship of $T_M \geq 230 \, M^{-1.2}$ in order to efficiently form the aforementioned Mn reaction layer that effectively acts for enhancing the adhesiveness. If $T_M < 230 \, M^{-1.2}$, a sufficient amount of Mn, necessary for the formation of the Mn reaction layer, cannot be supplied from the first layer (Y), thereby resulting in insufficient adhesiveness (see the later-described examples). Regarding the adhesiveness, it is better that the thickness $T_M$ of the first layer (Y) is large as far as the aforementioned requirement is satisfied; however, the electrical resistivity of the whole film is decreased if the thickness $T_M$ is too large, as stated above, and hence it is actually preferable to appropriately control the range of the thickness $T_M$ in view of the balance between the adhesiveness and the electrical resistivity.

The first layer (Y) may further contain oxygen to further enhance the adhesiveness to the transparent substrate. It can be considered that an oxygen-containing layer, which contains a predetermined amount of oxygen, is interposed on the interface with the transparent substrate by introducing an adequate amount of oxygen into the first layer (Y) that is brought into contact with the substrate and then strong bonding (chemical bonding) is formed with the substrate, thereby allowing for the adhesiveness to be enhanced.

In order to sufficiently exert the aforementioned action, the amount of oxygen contained in the first layer (Y) is preferably more than or equal to 0.5 atom %, more preferably more than or equal to 1 atom %, still more preferably more than or equal to 2 atom %, and even still more preferably more than or equal to 4 atom %. On the other hand, when the amount thereof is too large and accordingly the adhesiveness is too enhanced, a residue is left after the wet etching, thereby decreasing the property for wet etching. In addition, when the amount of oxygen is too large, the electrical resistance of the whole Cu alloy film is increased. Taking into consideration these viewpoints, the amount of oxygen contained in the first layer (Y) is preferably less than or equal to 30 atom %, more preferably less than or equal to 20 atom %, still more preferably less than or equal to 15 atom %, and even still more preferably less than or equal to 10 atom %.

Such an oxygen-containing first layer (Y) can be obtained by supplying oxygen gas during the formation of the first layer (Y) by a sputtering method. Oxygen ($O_2$) and an oxidizing gas (e.g., $O_3$, etc.) containing oxygen atoms can be used as an oxygen gas supply source. Specifically, it is better that a mixed gas, which is obtained by adding oxygen into a process gas typically used in a sputtering method, is used during the formation of the first layer (Y) and sputtering is performed during the formation of the second layer (X) by using the process gas into which oxygen is not added. It is because it is preferable that the second layer (X) does not contain oxygen from the viewpoint of reducing the electrical resistivity. Typical examples of the aforementioned process gas include rare gases (e.g., xenon gas, argon gas), and argon gas is preferably used. In addition, when the amount of oxygen gas in the process gas is changed during the formation of the first layer (Y), multiple lower layers each having an oxygen content different from others can be formed.

Because the amount of oxygen in the first layer (Y) can be changed by a mixture ratio of oxygen gas in the process gas, it is better to arbitrarily and appropriately change the aforementioned mixture ratio in accordance with the amount of oxygen to be introduced. For example, it is preferable that the amount of oxygen in the process gas (argon gas, etc.) is made to be more than or equal to 1 volume % and less than or equal to 20 volume % during the formation of the first layer (Y).

As demonstrated in the later-described examples, the aforementioned Cu alloy film is excellent in the adhesiveness to the transparent substrate represented by a glass substrate. The material of the glass substrate employed in the present invention is not particularly limited as far as the material can be used in a display device, and examples of the material include, for example, alkali-free glass, high strain point glass, and soda-lime glass, etc. In particular, according to the invention, the soda-lime glass is extremely excellent in the resistance for the migration of sodium ion (migration resistance), which has been a challenge when soda-lime glass is used, and hence inexpensive soda-lime glass can be preferably used as a substrate material instead of expensive alkali-free glass.

Because the Cu alloy film employed in the present invention is excellent in the adhesiveness to the transparent substrate, the film can be preferably used as a wiring film and electrode film that are directly brought into contact with the transparent substrate. For example, according to the embodiment directed to the display device of the later-described FIG. 1, the aforementioned Cu alloy film can be applied to a source electrode formed integrally with a signal wire and to a drain electrode and gate electrode that are brought into contact with a transparent conductive film.

The aforementioned Cu alloy film can also be applied as a wiring film or an electrode (source-drain electrode) film, which is directly brought into contact with the semiconductor layer (amorphous silicon or polycrystalline silicon) of a thin film transistor (TFT). If Cu is directly brought into contact with the semiconductor layer of a TFT, there arises the problem that, because Cu is also poor in the adhesiveness to the semiconductor layer, and in addition to that, mutual migration is likely to occur between Si in the semiconductor layer and Cu, the TFT performance is deteriorated; and hence the aforementioned film of a metal having high melting temperature (barrier metal layer), such as Mo and Cr, has been conventionally interposed. On the other hand, the Cu alloy of which the first layer (Y) is composed is also excellent in the adhesiveness to the semiconductor layer, and hence a multilayer structure can be adopted in which the Cu alloy of which the first layer (Y) is composed is formed directly on the semiconductor layer and pure Cu or the Cu alloy of which the second layer (Y) is composed is formed thereon. Thereby, the aforementioned mutual migration can be prevented even when a barrier metal layer is not interposed, and high adhesiveness to the semiconductor layer can be secured, and further a low electrical resistivity can be achieved. Furthermore, fine-processing excellent in forming a shape, by which a pattern can be easily formed, can be performed.

In connecting the Cu alloy film employed in the present invention to the semiconductor layer of a TFT, it may be made that the Cu alloy of which the first layer (Y) is composed and pure Cu or the Cu alloy of which the second layer (X) is composed are sequentially formed after the surface of the semiconductor layer has been nitrided by a plasma nitriding method, etc., besides the aforementioned method. That is, it may be made that, when viewed from the semiconductor layer side, a three-layer structure of nitrided semiconductor layer/first layer (Y)/second layer (X) is formed, and also with this, both the high adhesiveness to the semiconductor layer and the low electrical resistivity can be secured.

Alternatively, it may be made that, after the surface of the semiconductor layer has been nitrided by a plasma nitriding method, etc., a semiconductor layer is formed again and the Cu alloy of which the first layer (Y) is composed and pure Cu or the Cu alloy of which the second layer (X) is composed are sequentially formed thereon, besides the aforementioned method. That is, it may be made that, when viewed from the semiconductor layer side, a four-layer structure of nitrided semiconductor layer/semiconductor layer/first layer (Y)/second layer (X) is formed, and also with this, the same characteristics as stated above can be secured.

Alternatively, a method is also useful in which, in forming the Cu alloy film of which the first layer (Y) is composed by a sputtering method, an oxygen-containing first layer (Y) is formed by controlling oxygen gas in the same way as the transparent substrate, so that the oxygen-containing layer containing oxygen is interposed on the interface with the semiconductor layer; and also with this, the same characteristics as stated above can be achieved. That is, it may be made that, when viewed from the semiconductor layer side, a three-layer structure of semiconductor layer/oxygen-containing first layer (Y)/second layer (X) is formed. In addition, the surface of the semiconductor layer may be nitrided. Alternatively, a semiconductor layer, the surface of which is nitrided as stated above, and a semiconductor layer, the surface of which is not nitrided, may be laminated one on another. The preferred amount of oxygen contained in the oxygen-containing first layer (Y), etc., is the same as stated above.

It is preferable to form the Cu alloy film having the aforementioned multilayer structure by a sputtering method. Specifically, after the first layer (Y) has been formed by forming, by a sputtering method, a film of the material of which the first layer (Y) is composed, the second layer (X) is formed by forming, by a sputtering method, a film of the material of which the second layer (X) is composed, so that a multilayer structure is formed. It is preferable that, after the Cu alloy multilayer film has been formed in such a way, predetermined patterning is performed, and subsequently the sectional shape thereof is processed into a tapered shape, the taper angle of which is preferably about 45 to 60° from the viewpoint of coverage.

When a sputtering method is adopted, a Cu alloy film having almost the same composition as that of a sputtering target can be formed. Accordingly, the composition of the Cu alloy film can be adjusted by adjusting the composition of a sputtering target. The composition of a sputtering target may be adjusted by using a Cu alloy target having a different composition, or adjusted by chipping on an alloy element metal on a pure Cu target.

In a sputtering method, there are sometimes the cases where a little difference may occur between the composition of the formed Cu alloy film and that of a sputtering target. However, the difference is within approximately several atom %. Accordingly, a Cu alloy film having desired composition can be formed when the composition of a sputtering target is controlled so as to be within ±10 atom % at a maximum.

When the Cu alloy film employed in the present invention is applied on the semiconductor layer to be used as a source-drain electrode, it is also useful to employ a method of suppressing mutual migration in order to effectively suppress the mutual migration with a doped amorphous silicon; and examples of the method of suppressing mutual migration include a method of nitriding the surface of the doped amorphous silicon as stated above, a method of laminating a doped amorphous silicon again on the nitrided surface, and a method of forming, by a sputtering method, a film of a material of which the first layer (Y) is composed while oxygen is being added.

Hereinafter, the outline of the processes of manufacturing a TFT array substrate illustrated in FIG. 1 will be described in the order of the process views of FIGS. 2 to 9. Herein, an amorphous silicon TFT in which hydrogenated amorphous silicon is used as the semiconductor layer is illustrated by the thin film transistor formed as a switching device. The present invention is not limited thereto and polycrystalline silicon may be used. In addition, FIG. 1 illustrates an example of a TFT array substrate having a bottom-gate structure, but the invention is not limited thereto and may be applied to a TFT array substrate having a top-gate structure.

Figure 2:
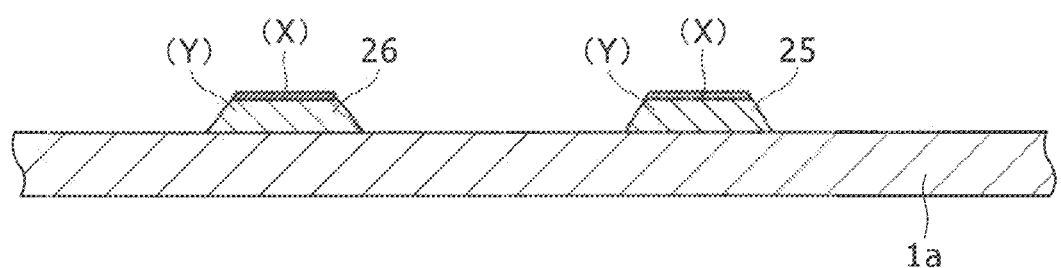
FIG. 2 is a sectional view illustrating, on a step-by-step basis, the processes of manufacturing a TFT array substrate according to an example.

The first layer (Y) composed of a Cu alloy thin film having a thickness of, for example, approximately 100 nm is first formed on a glass substrate 1a by a sputtering method, etc., and the second layer (X) composed of pure Cu or a Cu alloy thin film (thickness is approximately 100 nm) having an electrical resistivity lower than that of the first layer is then formed on the first layer by a sputtering method, etc., so that the total thickness thereof is, for example, approximately 200 nm; and subsequently a gate electrode 26 and a scanning line 25 are formed by patterning the Cu alloy laminated wiring film thus obtained (FIG. 2). In this case, it is better to etch the periphery of the Cu alloy laminated wiring film into a tapered shape having a taper angle of approximately 45 to 60° in order that the later-described coverage of a gate insulating film is well performed.

Figure 3:
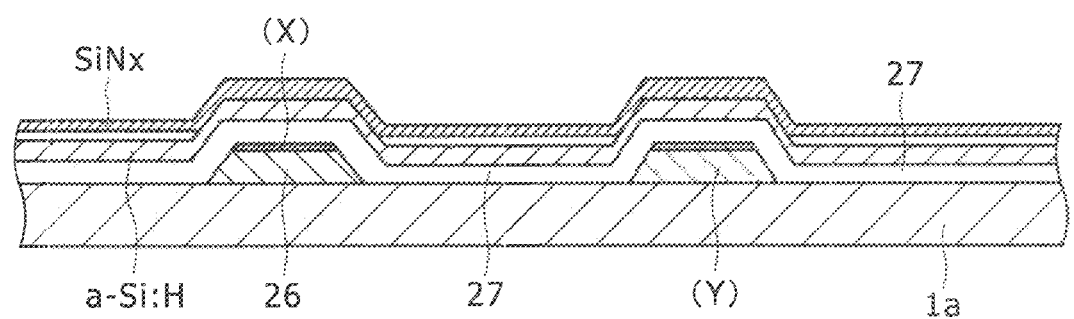
FIG. 3 is a sectional view illustrating, on a step-by-step basis, the processes of manufacturing the TFT array substrate according to the example.
Figure 4:
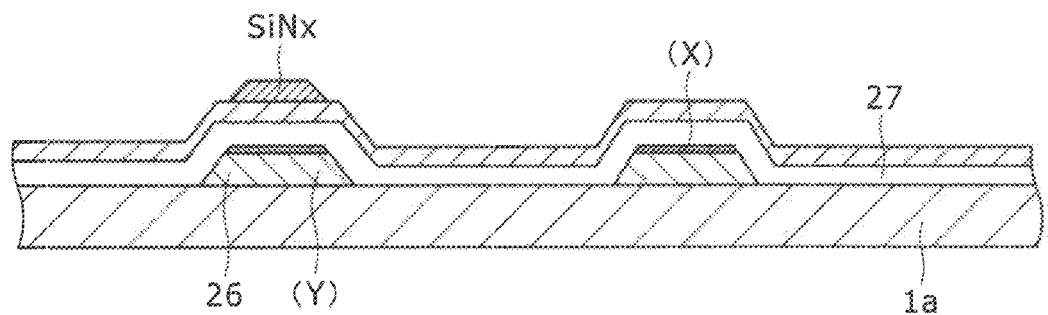
FIG. 4 is a sectional view illustrating, on a step-by-step basis, the processes of manufacturing the TFT array substrate according to the example.

Subsequently, as illustrated in FIG. 3, a gate insulating film (silicon nitride film: $SiN_x$) 27 having a thickness of, for example, approximately 300 nm is formed at the substrate temperature of approximately 350° C. by, for example, a plasma CVD method, etc. Subsequently, as illustrated in FIG. 4, the silicon nitride film ($SiN_x$) is patterned by the backside exposure in which the gate electrode 26 is used as a mask such that a channel protective film is formed. Further, a hydrogenated amorphous silicon film (a-Si: H) having a thickness of approximately 150 nm and an n⁺ type-hydrogenated amorphous silicon film (n⁺ a-Si: H) having a thickness of approximately 50 nm in which P has been doped, are continuously formed on the channel protective film at the substrate temperature of approximately 300° C.

Figure 5:
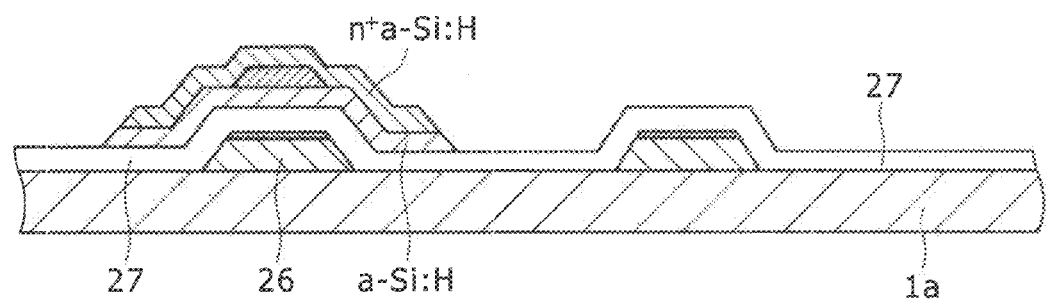
FIG. 5 is a sectional view illustrating, on a step-by-step basis, the processes of manufacturing the TFT array substrate according to the example.
Figure 6:
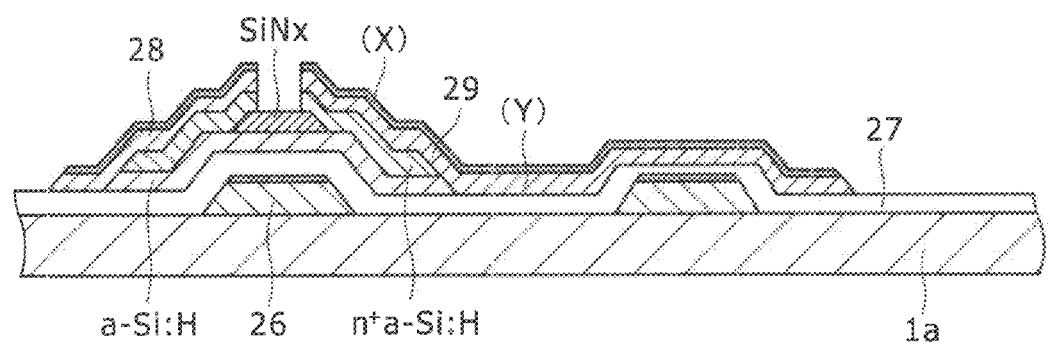
FIG. 6 is a sectional view illustrating, on a step-by-step basis, the processes of manufacturing the TFT array substrate according to the example.

Subsequently, as illustrated in FIG. 5, the hydrogenated amorphous silicon film (a-Si: H) and the n+ type-hydrogenated amorphous silicon film (n⁺ a-Si: H) are patterned by dry etching. Then, as illustrated in FIG. 6, the first layer (Y) composed of a Cu alloy thin film having a thickness of approximately 100 nm is formed, and the second layer (X) composed of pure Cu or a Cu alloy thin film (thickness is approximately 100 nm) having an electrical resistivity lower than that of the first layer is multilayer formed on the first layer by a sputtering method, etc., so that the total thickness thereof is approximately 200 nm; and subsequently a source electrode 28 formed integrally with a signal wire and a drain electrode 29 in contact with an ITO transparent conductive film are formed by patterning the multilayer film with wet etching. Further, the n⁺ type-hydrogenated amorphous silicon film (n⁺ a-Si: H) on the channel protective film ($SiN_x$) is removed by dry etching with the source electrode 28 and the drain electrode 29 being used as a mask.

Figure 7:
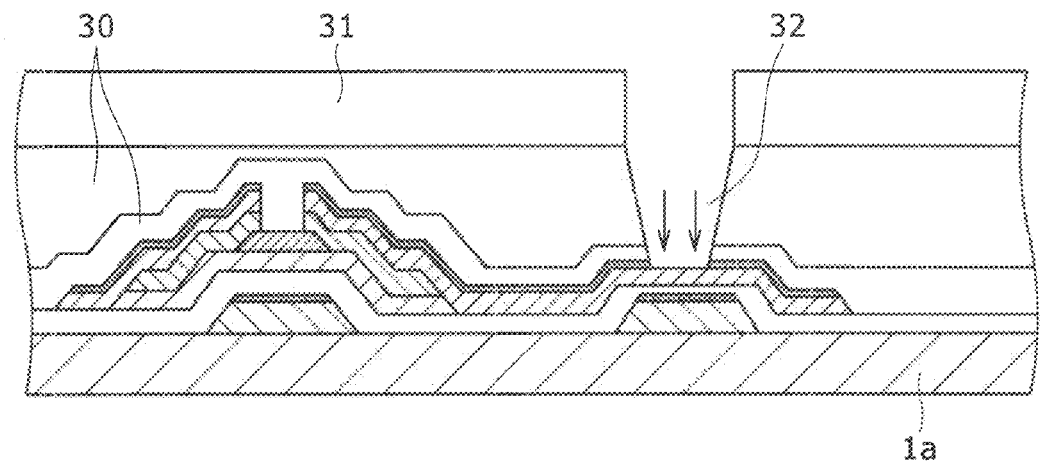
FIG. 7 is a sectional view illustrating, on a step-by-step basis, the processes of manufacturing the TFT array substrate according to the example.
Figure 8:
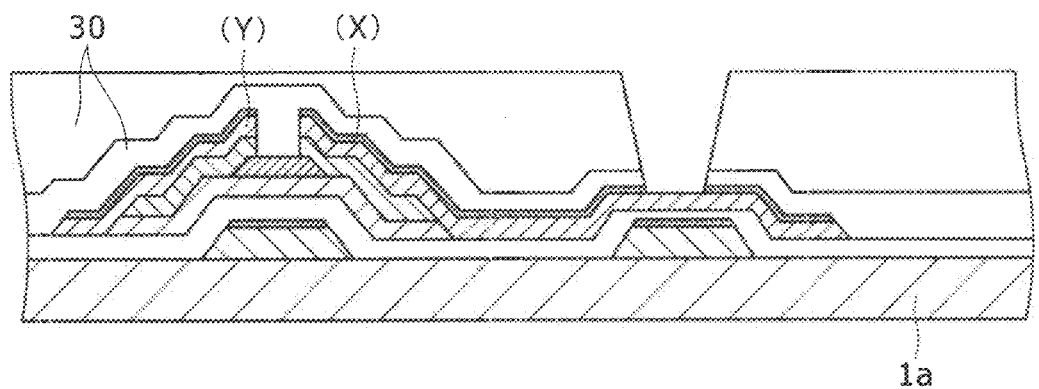
FIG. 8 is a sectional view illustrating, on a step-by-step basis, the processes of manufacturing the TFT array substrate according to the example.

Subsequently, as illustrated in FIG. 7, a protective film is formed by forming, with a plasma CVD apparatus, a silicon nitride film ($SiN_x$) 30 such that the thickness thereof is approximately 300 nm. At the time, it is preferable that the silicon nitride film 30 is formed at the temperature of, for example, approximately 250° C. Subsequently, a contact hole 32 is formed in the silicon nitride film ($SiN_x$) 30. Further, as illustrated in FIG. 8, a photoresist 31 is peeled off by using, for example, a non-amine remover after the polymer removing process with the use of oxygen plasma ashing, and subsequently a Cu oxide film generated by the oxygen plasma ashing is removed with diluted hydrofluoric acid.

Figure 9:
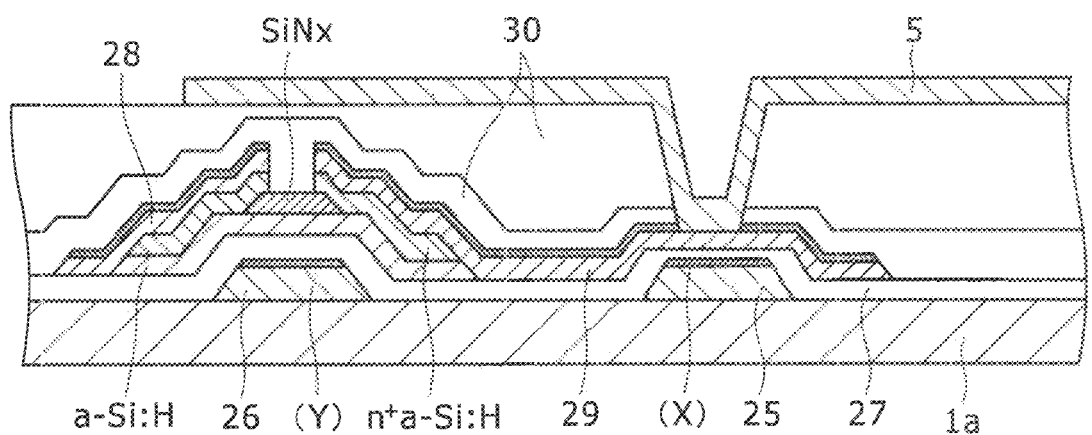
FIG. 9 is a sectional view illustrating, on a step-by-step basis, the processes of manufacturing the TFT array substrate according to the example.

Finally, as illustrated in FIG. 9, the ITO transparent conductive film having a thickness of, for example, approximately 150 nm is formed at room temperature by a sputtering method and then a pixel electrode (ITO transparent conductive film) 5 is formed by pattering with wet etching, thereby allowing for the TFT array substrate to be completed.

According to the manufacturing process, a TFT array substrate can be obtained in which: (i) the gate electrode is formed in the state of being brought into direct contact with the glass substrate and having high adhesiveness to the substrate; (ii) the source-drain electrode is formed so as to have high adhesiveness to the doped amorphous silicon; (iii) the ITO transparent conductive film (pixel electrode) 5 and the drain electrode formed by the Cu alloy multilayer film are brought into direct contact with each other; and (iv) the ITO transparent conductive film 5 is also brought into direct contact with the TAB portion of the scanning line linking to the gate electrode.

EXAMPLES

Hereinafter, the present invention will be described more specifically with reference to examples; however, the invention is not limited by the following examples, and it can be practiced by being appropriately modified within a scope adaptable to the purport described before and after, and any of such modifications may be covered within a technical scope of the invention.

Example 1

Production of Samples

In the present example, with respect to the samples (Nos. 3 to 35) shown in Table 1 produced in the following way, influences on the electrical resistivity and the adhesiveness to the glass substrate by the type and content of the Cu alloy of which the first layer (Y) was composed and by the thickness of the first layer (Y) were investigated.

Cu alloy films each having the multilayer structure, which includes the first layer (Y) composed of a Cu alloy containing various elements shown in Table 1 and the second layer (X) composed of pure Cu, were produced as described below by a sputtering method. In Table 1, each of Nos. 3 to 16 represents an example in which Mn was added as the element of which the first layer (Y) was composed, No. 17 represents an example in which Bi was added, each of Nos. 18 to 21 represents an example in which Ni was added, each of Nos. 21 to 23 represents an example in which Zn was added, each of Nos. 24 and 25 represents an example in which Al was added, each of Nos. 26 and 27 represents an example in which Ti was added, each of Nos. 28 and 29 represents an example in which Mg was added, each of Nos. 30 and 31 represents an example in which Ca was added, each of Nos. 32 and 33 represents an example in which Nb was added, and each of Nos. 34 and 35 represents an example in which W was added. The thickness of the wiring film was made constant at approximately 300 nm in the whole multilayer structure.

Sputtering was performed under the following conditions. Multilayer wiring films each having the first layer (Y) composed of a Cu alloy film (thickness thereof is shown in Table 1) and the second layer (X) composed of a Cu metal film were formed on glass substrates (#1737 made by Corning Incorporated, size: 50.8 mm in diameter×0.7 mm in thickness) by using a sputtering apparatus with a product name of "HSM-552" made by Shimadzu Corporation and by a DC magnetron sputtering method (back pressure: $0.27 \times 10^{-3}$ Pa or lower, Ar gas pressure: 0.27 Pa, Ar gas flow rate: 30 sccm, sputtering power: DC 260 W, distance between electrodes: 50.4 mm, substrate temperature: room temperature).

A sample (No. 36) was further produced in which the oxygen-containing first layer (Y) was formed on a glass substrate (#1737 made by Corning Incorporated). Herein, the oxygen-containing first layer (Y) was formed by using a mixed gas of Ar and $O_2$ as a process gas and by adjusting the ratio of the oxygen gas in the mixed gas to 10 volume %.

Other film-forming conditions are as follows:
Back pressure: $1.0 \times 10^{-6}$ Torr or lower
Process gas pressure: $2.0 \times 10^{-3}$ Torr
Process gas flow rate: 30 sccm
Sputtering power: 3.2 W/cm$^2$
Distance between electrodes: 50 mm Substrate temperature: room temperature
Film-forming temperature: room temperature
Compositions of the Cu alloy films formed as stated above were confirmed by a quantitative analysis using an ICP emission spectrometer (with a product name of "ICP-8000" made by Shimadzu Corporation).

For comparison, a sample (No. 1) having barrier metal layers on and underneath the pure Cu and a sample (No. 2) composed only of pure Cu were prepared.

Using the aforementioned each sample, the electrical resistivity of the Cu alloy film itself and the adhesiveness to the glass substrate were investigated in the following way.

Measurement of Electrical Resistance

Each Cu alloy multilayer wiring film formed on the glass substrate (#1737 made by Corning Incorporated, size: 101.6 mm in diameter×0.7 mm in thickness) was processed into a pattern for evaluating an electrical resistance with a line width of 100 μm and a line length of 10 mm by photo lithography and wet etching. In this case, a mixed liquid made of sulfuric acid:nitric acid:acetic acid=50:10:10 was used as a wet etchant. A vacuum heat treatment (vacuum degree: $0.27 \times 10^{-3}$ Pa or lower) was performed at 350° C. for 30 minutes after the substrate was heated by using a single wafer processing CVD apparatus, and an electrical resistance after the vacuum heat treatment was measured at room temperature by a direct current four-probe method.

In the present Example 1, the criterion for determining whether the electrical resistance passed was that an electrical resistance less than or equal to 3.5 μΩ*cm, which is an electrical resistance of conventional Cu-based materials, passed (○) and an electrical resistance exceeding this value failed (×).

Evaluation of Adhesiveness to Glass Substrate

The adhesiveness of the Cu alloy film after the heat treatment (at 350° C. for 0.5 hours under vacuum atmosphere) was evaluated by a peel off test using tape. In detail, cuts were made in a grid pattern at intervals of 1 mm on the surface of the Cu alloy formed film with a cutter knife. Subsequently, black polyester tape (product No. 8422B made by SUMITOMO 3M LIMITED) was firmly attached to the surface of the formed film, and then the tape was peeled off at once while being maintained such that the peel off angle of the tape was 60°; thereafter, the number of sections of the grid, which had not been peeled off by the tape, was counted to determine a ratio to the total sections (residual film ratio). Measurements were performed three times and the average thereof was taken as a residual film ratio of each sample.

In the present example, the Cu alloy film having a peel off ratio of 0 to less than 10% was determined to be ⊚, that having a peel off ratio of 10% or more to less than 20% was determined to be ○, and that having a peel off ratio of 20% or more is determined to be ×, and the Cu alloy film with ⊚ or ○ was determined to pass (good in the adhesiveness to the glass substrate).

As the comprehensive evaluation, the Cu alloy film that had passed the adhesiveness and the electrical resistance was determined to be ○, whereas other Cu alloy films were determined to be ×.

These results are shown in Table 1.

TABLE 1

| No. | Composition of first layer (Y) (atom %) | Thickness of first layer (nm) | Composition of second layer (X) (atom %) | Total thickness (nm) | Ratio of first layer(Y) (%) | Adhesiveness Peel off ratio after heat treatment at 350° C. | Electrical resistivity After heat treatment at 350° C. (μΩ·cm) | Determination | Comprehensive evaluation |
|---|---|---|---|---|---|---|---|---|---|
| 1 | Mo (20 nm)/pure Cu (260 nm)/Mo (20 nm) | | | | | ⊚ | 2.8 | ○ | ○ |
| 2 | Pure Cu (300 nm) | | | | | X | 2.1 | ○ | X |
| 3 | Cu—0.1Mn | 20 | Pure Cu | 300 | 7 | X | 2.2 | ○ | X |
| 4 | Cu—0.1Mn | 150 | Pure Cu | 300 | 50 | X | 2.3 | ○ | X |

TABLE 1-continued

| No. | Composition of first layer (Y) (atom %) | Thickness of first layer (nm) | Composition of second layer (X) (atom %) | Total thickness (nm) | Ratio of first layer(Y) (%) | Adhesiveness Peel off ratio after heat treatment at 350° C. | Electrical resistivity After heat treatment at 350° C. ($\mu\Omega \cdot cm$) | Determination | Comprehensive evaluation |
|---|---|---|---|---|---|---|---|---|---|
| 5 | Cu—0.1Mn | 200 | Pure Cu | 300 | 67 | X | 2.3 | ○ | X |
| 6 | Cu—0.5Mn | 5 | Pure Cu | 300 | 2 | X | 2.2 | ○ | X |
| 7 | Cu—0.5Mn | 20 | Pure Cu | 300 | 7 | ○ | 2.3 | ○ | X※ |
| 8 | Cu—0.5Mn | 50 | Pure Cu | 300 | 17 | ○ | 2.3 | ○ | X※ |
| 9 | Cu—2.0Mn | 5 | Pure Cu | 300 | 2 | X | 2.2 | ○ | X |
| 10 | Cu—2.0Mn | 20 | Pure Cu | 300 | 7 | ◎ | 2.6 | ○ | ○ |
| 11 | Cu—2.0Mn | 50 | Pure Cu | 300 | 17 | ◎ | 2.8 | ○ | ○ |
| 12 | Cu—2.0Mn | 100 | Pure Cu | 300 | 33 | ◎ | 3.2 | ○ | ○ |
| 13 | Cu—5.0Mn | 5 | Pure Cu | 300 | 2 | X | 2.4 | ○ | X |
| 14 | Cu—5.0Mn | 20 | Pure Cu | 300 | 7 | ◎ | 2.8 | ○ | ○ |
| 15 | Cu—5.0Mn | 50 | Pure Cu | 300 | 17 | ◎ | 3.1 | ○ | ○ |
| 16 | Cu—5.0Mn | 100 | Pure Cu | 300 | 33 | ◎ | 3.3 | ○ | ○ |
| 17 | Cu—2.0Bi | 50 | Pure Cu | 300 | 17 | X | 6.2 | X | X |
| 18 | Cu—2.0Ni | 10 | Pure Cu | 300 | 3 | X | 2.4 | ○ | X |
| 19 | Cu—2.0Ni | 50 | Pure Cu | 300 | 17 | ○ | 2.9 | ○ | ○ |
| 20 | Cu—5.0Ni | 50 | Pure Cu | 300 | 17 | ○ | 3.3 | ○ | ○ |
| 21 | Cu—2.0Zn | 10 | Pure Cu | 300 | 3 | X | 2.5 | ○ | X |
| 22 | Cu—2.0Zn | 50 | Pure Cu | 300 | 17 | ○ | 3.0 | ○ | ○ |
| 23 | Cu—5.0Zn | 50 | Pure Cu | 300 | 17 | ○ | 3.3 | ○ | ○ |
| 24 | Cu—2.0Al | 50 | Pure Cu | 300 | 17 | ○ | 2.7 | ○ | ○ |
| 25 | Cu—5.0Al | 50 | Pure Cu | 300 | 17 | ○ | 3.5 | ○ | ○ |
| 26 | Cu—2.0Ti | 50 | Pure Cu | 300 | 17 | ○ | 2.8 | ○ | ○ |
| 27 | Cu—5.0Ti | 50 | Pure Cu | 300 | 17 | ○ | 3.5 | ○ | ○ |
| 28 | Cu—2.0Mg | 50 | Pure Cu | 300 | 17 | ○ | 2.4 | ○ | ○ |
| 29 | Cu—5.0Mg | 50 | Pure Cu | 300 | 17 | ○ | 3.2 | ○ | ○ |
| 30 | Cu—2.0Ca | 50 | Pure Cu | 300 | 17 | ○ | 2.5 | ○ | ○ |
| 31 | Cu—5.0Ca | 50 | Pure Cu | 300 | 17 | ○ | 3.3 | ○ | ○ |
| 32 | Cu—2.0Nb | 50 | Pure Cu | 300 | 17 | ○ | 2.8 | ○ | ○ |
| 33 | Cu—5.0Nb | 50 | Pure Cu | 300 | 17 | ○ | 3.4 | ○ | ○ |
| 34 | Cu—2.0W | 50 | Pure Cu | 300 | 17 | ○ | 2.8 | ○ | ○ |
| 35 | Cu—5.0W | 50 | Pure Cu | 300 | 17 | ○ | 3.4 | ○ | ○ |
| 36 | Pure Cu(225 nm)/Addition of 10% oxygen Cu—1.0Mn(75 nm) | | | | | ◎ | 2.8 | ○ | ○ |

※Nos. 7 and 8 were determined to be "X" due to lack of reproducibility with respect to adhesiveness.

In Table 1, all of: Nos. 10 to 12 and Nos. 14 to 16 (these represent examples in which Mn was added as an element of which the first layer Y was composed), Nos. 19 and 20 (these represent examples in which Ni was added), Nos. 22 and 23 (these represent examples in which Zn was added), Nos. 24 and 25 (these represent examples in which Al was added), Nos. 26 and 27 (these represent example in which Ti was added), Nos. 28 and 29 (these represent examples in which Mg was added), Nos. 30 and 31 (these represent examples in which Ca was added), Nos. 32 and 33 (these represent examples in which Nb was added), and Nos. 34 and 35 (these represent examples in which W was added), satisfy the requirements of the present invention, and hence both low electrical resistivity and high adhesiveness to the glass substrate were achieved.

On the other hand, No. 2 represents an example composed only of pure Cu and is inferior in the adhesiveness to the glass substrate.

Each of Nos. 3 to 5 represents an example in which an amount of the element of which the first layer (Y) is composed is small, and the adhesiveness to the glass substrate was decreased.

Each of Nos. 6, 9, and 13 represents an example in which the element of which the first layer (Y) was composed was Mn; however, the thickness of the first layer (Y) was small, and in No. 6, the amount of Mn was also insufficient, and hence the adhesiveness to the glass substrate was decreased. Nos. 18 and 21 represent examples in which Ni and Zn were respectively used, but because each thickness was smaller than the preferred one when Ni or Zn is used, the adhesiveness of the two were insufficient.

Nos. 7 and 8 represent examples in each of which the element of which the first layer (Y) was composed was Mn and the content thereof was 0.5 atom %. In the present Example 1, good adhesiveness was demonstrated; however, it has been confirmed that, in the later-described Example 3, the adhesiveness was insufficient when the amount of Mn was 0.5 atom %, and accordingly the comprehensive evaluation of the two were determined to be "x" due to lack of reproducibility.

No. 17 represents an example in which Bi, which is an alloy element not specified in the present invention, was contained, and it was found that the adhesiveness to the glass substrate was decreased and the electrical resistivity was increased.

No. 36 represents an example in which the first layer (Y) contains oxygen, and good adhesiveness can be achieved even when the amount of Mn is smaller than the range specified in the present invention.

Example 2

In the present example, the adhesiveness of each of the samples (present invention examples and comparative examples), which had used soda-lime glass and been produced in the following way, was investigated after the DC stress test and the peeling test. The DC stress test is a test method for checking a change in the leak current between electrodes and a change in the appearance, such as occurrence of peel off and formation of a foreign substance, while patterns electrically spaced apart from each other with a constant distance between them, are being maintained in a state of constant electric field strength being held between the patterns when a stress, which is a constant drive voltage (direct current), is applied between them. The DC stress test is useful as a test method in which an abnormality in the wiring, occurring due to the transfer of an electrical charge by a normal panel operation, can be checked in a short period of time by applying, in constant temperature and humidity atmosphere (temperature: 80° C., humidity: 80%), a voltage higher than a normally applied voltage. Herein, the stress test was performed by two comb-shaped electrode patterns in each of which a line & space pattern having a line width of 10 μm and a space of 30 μm had been formed being alternately superimposed one on another to make the distance between the respective lines to be 10 μm, and by applying 0 V to one of the electrode patterns and DC 40 V to the other thereof.

(1) Production of Samples for DC Stress Test

A Cu alloy film (total thickness: 300 nm) of the present invention example, having the multilayer structure, which includes the first layer (Y) composed of a Cu—Mn alloy (Cu-2 atom % Mn, thickness: 100 nm) and the second layer composed of pure Cu (thickness: 200 nm) was produced on a soda-lime glass substrate (o-glass made by SNP Co., Ltd. (Korea), 50.8 mm in diameter×0.7 mm in thickness) by the sputtering method described in the aforementioned Example 1. For comparison, a pure Cu single layer film (total thickness: 300 nm) and a pure Al single layer film (total thickness: 300 nm) were produced in the same way as stated above.

Figure 10:
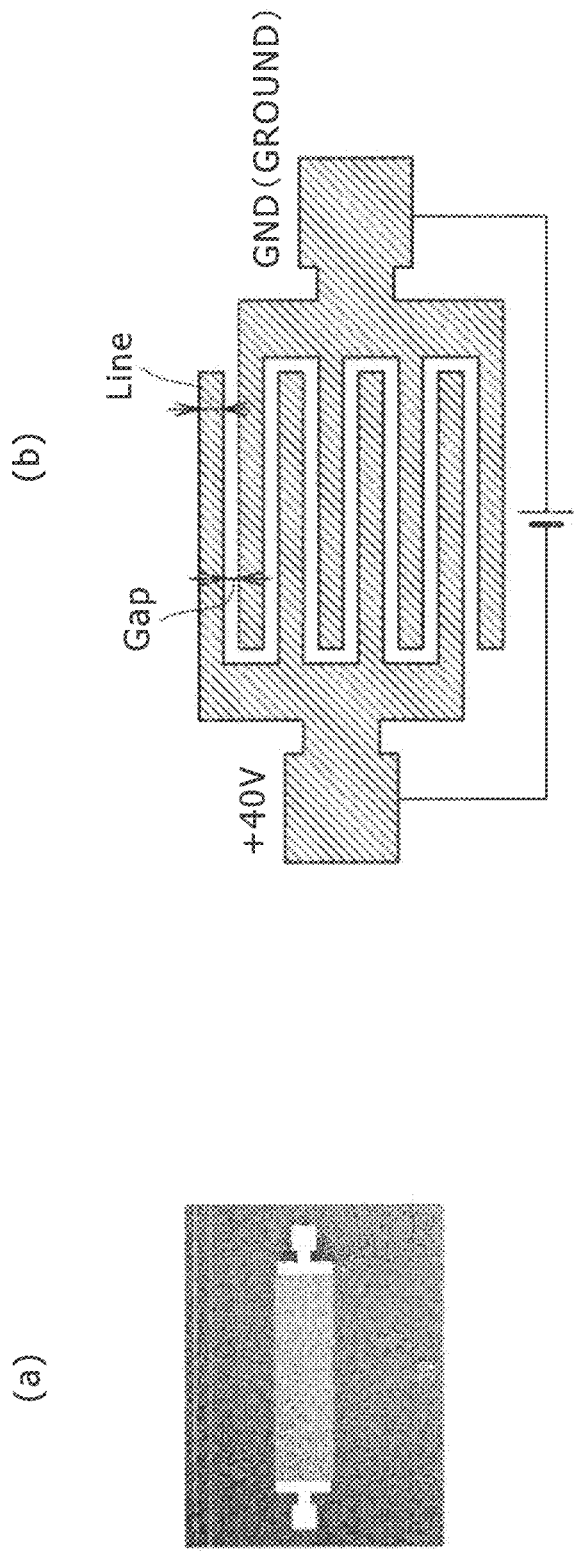
FIG. 10(a) is an optical microscope photograph of a TEG pattern used for a DC stress test in the example.
FIG. 10(b) is a view schematically illustrating the TEG pattern.

Subsequently, each of the aforementioned films was processed into a comb-shaped TEG pattern having a line width of 10 μm and a gap width of 10 μm by photo lithography and wet etching, and thereby samples for the DC stress test, illustrated in FIGS. 10(a) and 10(b), were obtained. In this case, a mixed liquid made of sulfuric acid:nitric acid:acetic acid=50:10:10 was used as a wet etchant. Subsequently, after the resist was peeled off, a sample according to the present example, which had been subjected to a heat treatment at 350° C. for 30 minutes under nitrogen atmosphere, was prepared, whereas samples of the pure Cu film and the pure AL film, according to the comparative examples, which had not been subjected to the aforementioned heat treatment, were prepared.

(2) Evaluation of Adhesiveness by DC Stress Test

Subsequently the DC stress test was performed on every sample in the following way. DC stress was applied by using a semiconductor parameter analyzer (Agilent 4156C made by Agilent Technologies, Inc.), in which DC 40 V was applied to one pad of the comb-shaped TEG pattern (anode electrode) and 0 V was applied to the other pad thereof (cathode electrode) in a heated environment of 80° C., as illustrated in FIGS. 10(a) and 10(b). The DC stress was being applied for five hours and the adhesiveness between each thin film and the soda-lime glass was evaluated before and after the DC stress was applied. The adhesiveness was evaluated by observing presence or absence of peel off of the film in any observing field of view (300 μm×400 μm) using an optical microscope (objective lens: 100 magnification, eye lens: 10 magnification), and a thin film in which peel off had been observed was evaluated to be "x", whereas a thin film in which peel off had not been observed was evaluated to be "○".

(3) Evaluation of Adhesiveness by Tape Peeling Test

The 84222B tape made by 3M LIMITED, which was used in the aforementioned Example 1, was firmly attached to the surface of the sample to which DC stress had been applied, and a peel off test (60° peel test) was performed in the same way as the aforementioned Example 1, and thereby the adhesiveness was evaluated by observing presence or absence of peel off of the film by an optical microscope in the same way as stated above.

Figure 11:
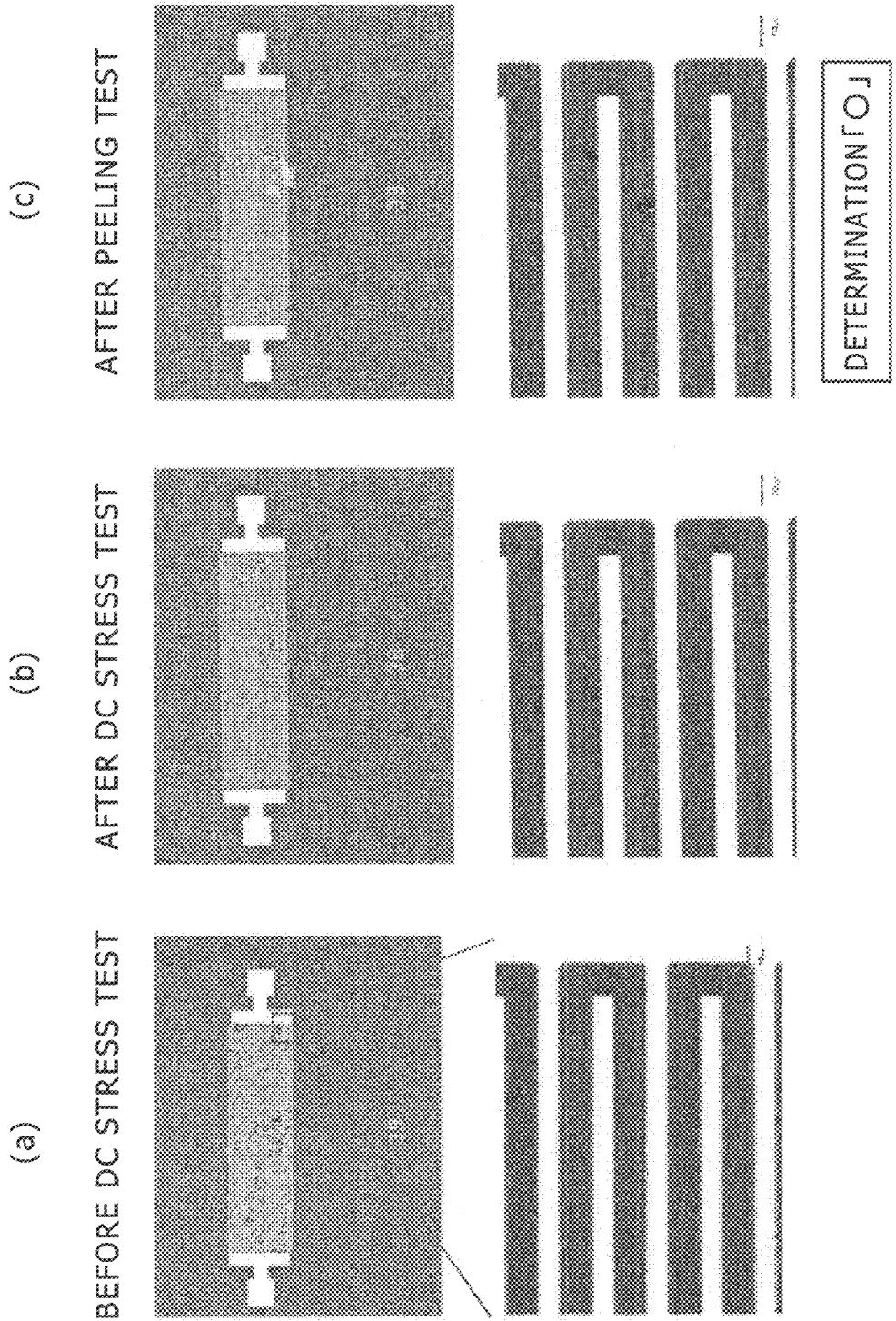
FIG. 11(a) is an optical microscope photograph thereof taken before the DC stress test when a Cu—Mn alloy (after annealed at 350° C.) is used.
FIG. 11(b) is an optical microscope photograph thereof taken after the DC stress test when the Cu—Mn alloy (after annealed at 350° C.) is used.
FIG. 11(c) is an optical microscope photograph thereof taken after a peeling test has been performed on the material after the DC stress test when the Cu—Mn alloy (after annealed at 350° C.) is used.
Figure 12:
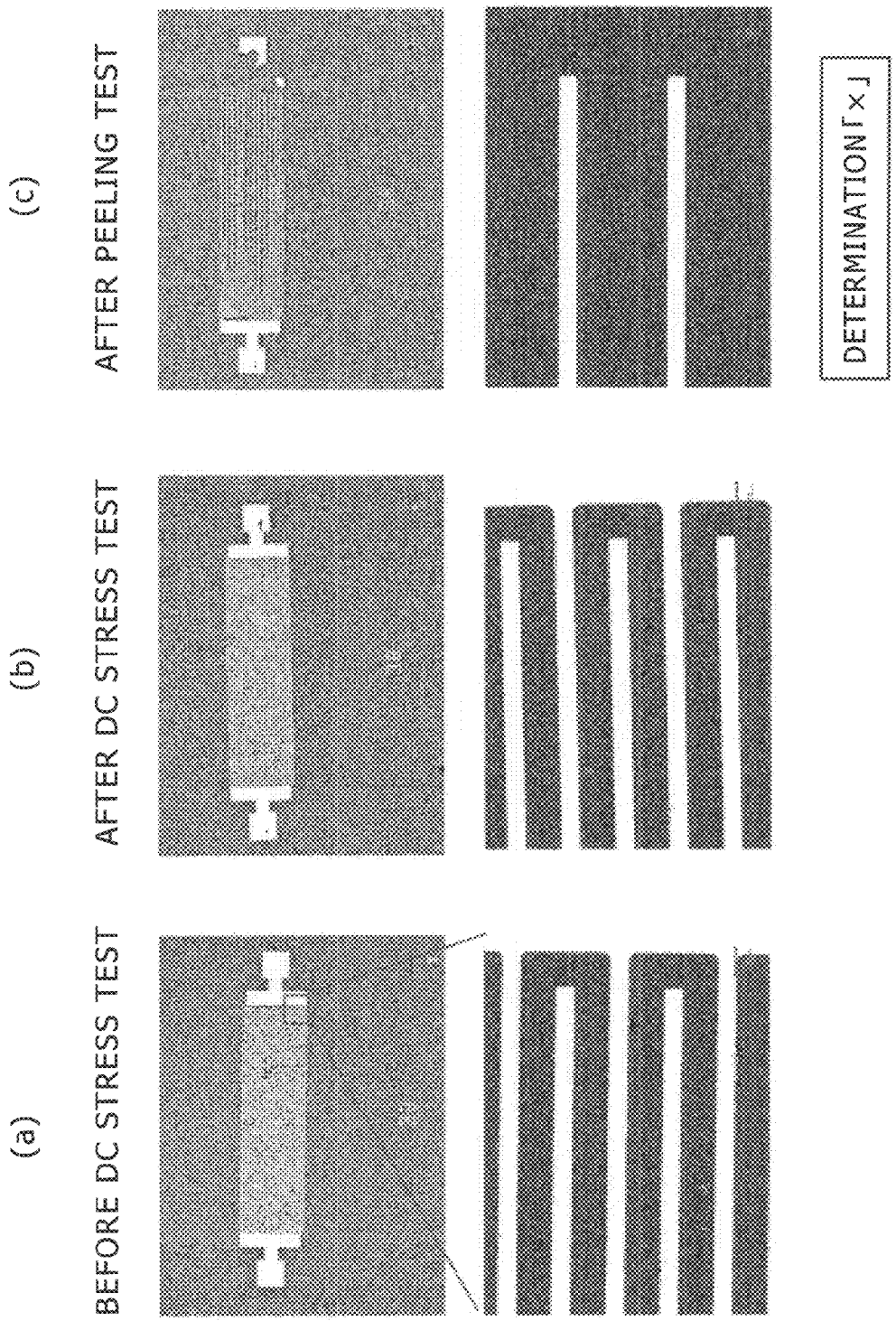
FIG. 12(a) is an optical microscope photograph thereof taken before the DC stress test when pure Cu (in the same state as being formed) is used.
FIG. 12(b) is an optical microscope photograph thereof taken after the DC stress test when the pure Cu (in the same state as being formed) is used.
FIG. 12(c) is an optical microscope photograph thereof taken after the peeling test has been performed on the material after the DC stress test when the pure Cu (in the same state as being formed) is used.
Figure 13:
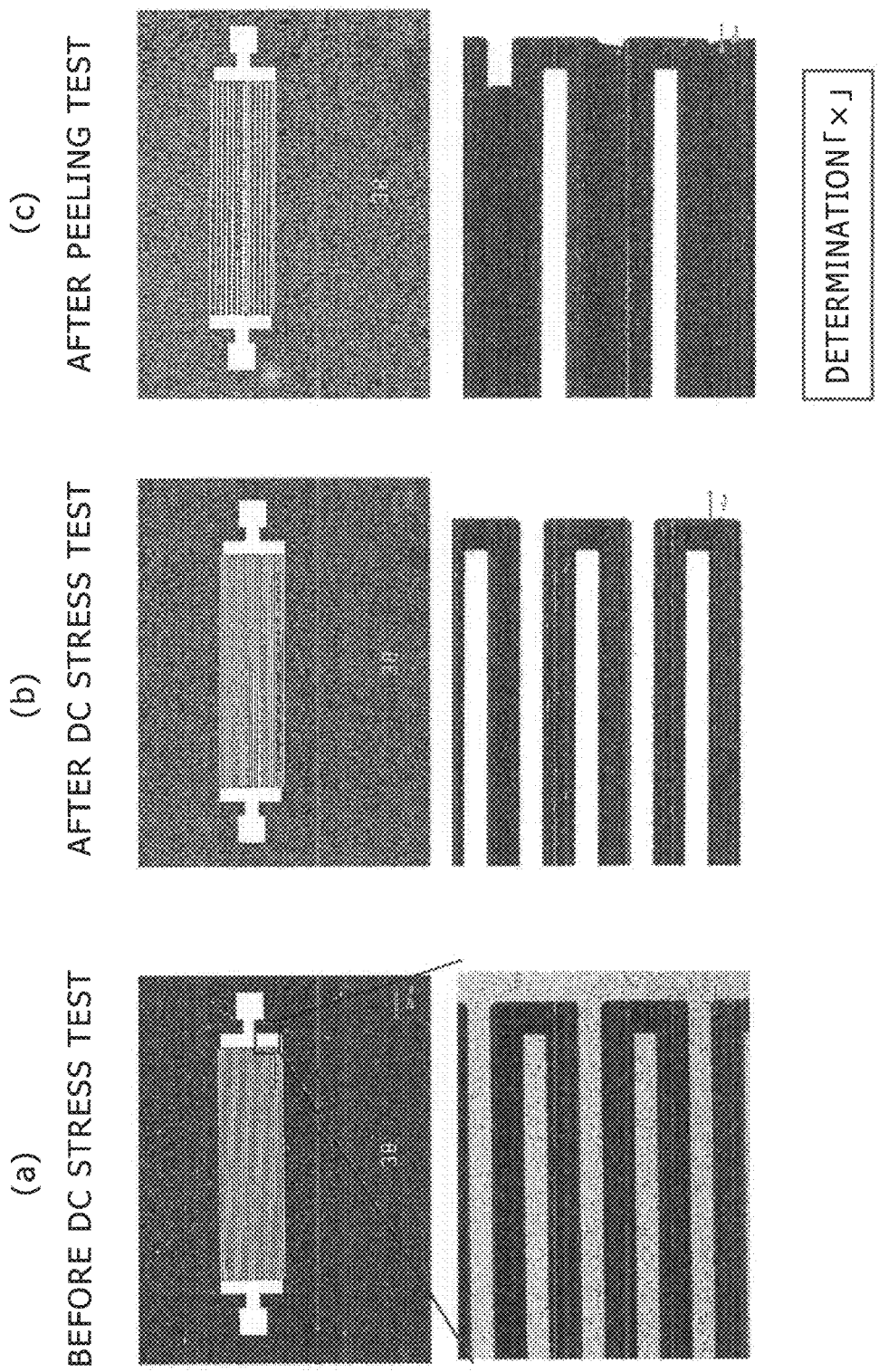
FIG. 13(a) is an optical microscope photograph thereof taken before the DC stress test when an Al—Nd alloy (in the same state as being formed) is used.
FIG. 13(b) is an optical microscope photograph thereof taken after the DC stress test when the Al—Nd alloy (in the same state as being formed) is used.
FIG. 13(c) is an optical microscope photograph thereof taken after the peeling test has been performed on the material after the DC stress test when the Al—Nd alloy (in the same state as being formed) is used.

These results are illustrated in FIGS. 11(a) to 11(c), FIGS. 12(a) to 12(c), and FIGS. 13(a) to 13(c). FIGS. 11(a) to 11(c) illustrate the results when the Cu—Mn alloy film according to the present invention example (after heat treatment at 350° C.) was used, FIGS. 12(a) to 12(c) illustrate the results of the comparative example (pure Cu, without a heat treatment, in the same state as being formed), and FIGS. 13(a) to 13(c) illustrate the results of the comparative example (Al—Nd alloy, without a heat treatment, in the same state as being formed).

When the Cu—Mn alloy film according to the present invention example was used, peel off of the film was not observed in both after the DC stress test and after the peeling test.

On the other hand, when pure Cu (see FIGS. 12(a) to 12(c)) was used, peel off of the film was observed in the peeling test performed after the DC stress test.

In detail, peel off of the film occurred only on the cathode electrode side, as illustrated in FIG. 12(c). Accordingly, it was presumed that the peel off might have occurred due to the migration of the sodium ion from the soda-lime glass. It can be presumed that, because the Mn—Si—O layer was formed on the interface with the soda-lime glass and the layer functioned as a barrier for the migration of the sodium ion when the Cu—Mn alloy film according to the present invention example had been used, peel off of the film did not occur.

As illustrated in FIGS. 13(a) to 13(c), also in the case where an Al—Nd alloy was used and the film was tested in the same state as being formed without a heat treatment, peel off of the film occurred in the peeling test performed after the DC stress test.

Example 3

In the present example, Mn was used as the element of which the first layer (Y) was composed, and influences on the adhesiveness to the glass substrate and the electrical resistivity by the content of Mn and the thickness of the first layer (Y) were investigated further in detail.

(1) Evaluation of Adhesiveness to Glass Substrate

The multilayer film including the first layer (Y) and the second layer (X) was formed on a glass substrate in the same way as Example 1, except that EAGLE 2000 (size: 4 inches in diameter×0.7 mm in thickness) made by Corning Incorporated was used as the glass substrate, the thickness of the first layer (Y) was changed between 5 and 100 nm, and that of the second layer (X) was made constant at 500 nm. After the multilayer film was formed, a heat treatment was further performed at 320° C. for 5 minutes under 1 Pa of nitrogen atmosphere by using a CVD apparatus. Subsequently, cuts were made in a grid pattern of 5×5 cells at intervals of 1 mm on the surface of the formed film with a cutter knife, and the 8422B tape made by SUMITOMO 3M LIMITED was firmly attached to the surface of the formed film and then the tape was peeled off at once such that the angle with the substrate was 90°. In the present example, a film in which even a single cell had been peeled off was evaluated to fail "x", whereas a film in which no cell had been peeled off was evaluated to pass "○".

Figure 14:
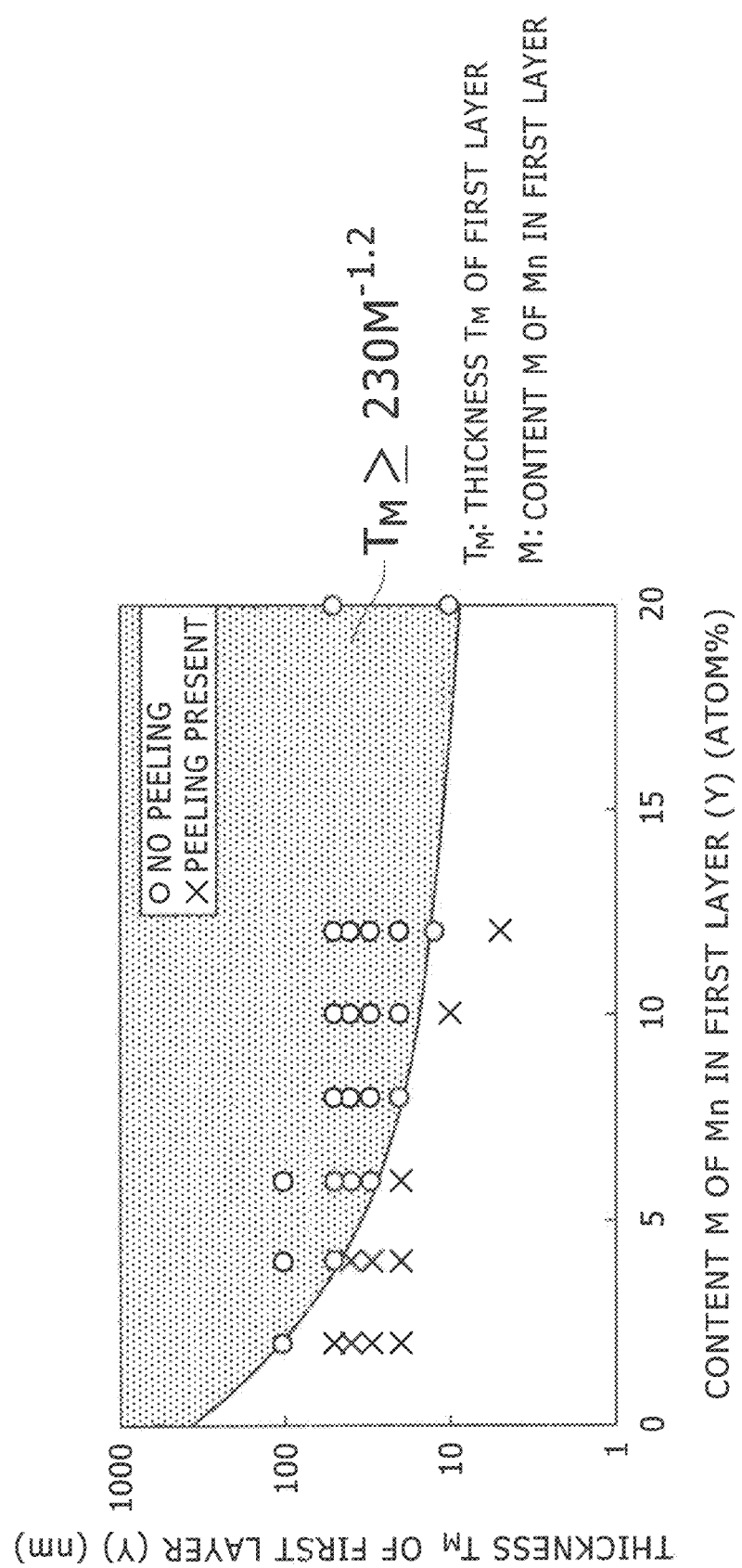
FIG. 14 is a graph illustrating influences on the adhesiveness by the content (atom %) of Mn in a first layer (Y) and the thickness (nm) of the first layer.

The results are shown in Table 2 and FIG. 14.

TABLE 2

| Thickness of First Layer (Y) (nm) | Amount of Mn in First Layer (Y) (atom %) | | | | | | |
|---|---|---|---|---|---|---|---|
| | 2 | 4 | 6 | 8 | 10 | 12 | 20 |
| 5 | | | | | | X | |
| 10 | | | | | X | | O |
| 12 | | | | | | O | |
| 20 | X | X | X | O | O | O | |
| 30 | X | X | O | O | O | O | |
| 40 | X | X | O | O | O | O | O |
| 50 | X | O | O | O | O | | |
| 100 | O | O | O | | | | |

(O: No peeling, X: Peeling present)

It can be read from Table 2 and FIGS. 14(a) to 14(c) that: it is effective to mutually control the amount of Mn in the first layer (Y) and the thickness of the first layer (Y) in order to enhance the adhesiveness between the first layer (Y) and the glass substrate; and there is the tendency that, when the amount of Mn is small, the adhesiveness is enhanced by making the thickness large and when the thickness is small, the adhesiveness is enhanced by making the amount of Mn large. The tendency can be arranged by the relational expression of $T_M \geq 230\ M^{-1.2}$, and good adhesiveness can be obtained when the aforementioned relational expression is satisfied. In addition, in the evaluation of the adhesiveness in Example 1, Cu alloy films each having a peel off ratio by tape of 0 to less than 10% were all evaluated to be ⊚, whereas in the present Example 3, a film in which even a single cell had been peeled off was evaluated to fail "x", and accordingly films are more strictly evaluated in Example 3 than in Example 1. That is, of the Cu alloy films evaluated as to be ⊚, the Cu alloy films that satisfy the aforementioned $T_M \geq 230\ M^{-1.2}$ (Nos. 12, 15, and 16 in Table 1) correspond to the case where no cell was peeled off, and the Cu alloy films that do not satisfy the aforementioned relational expression (Nos. 10, 11, and 14 in Table 1) correspond to the case where cells were peeled off within the limit where a peel off ratio was less than 10%.

Figure 15:
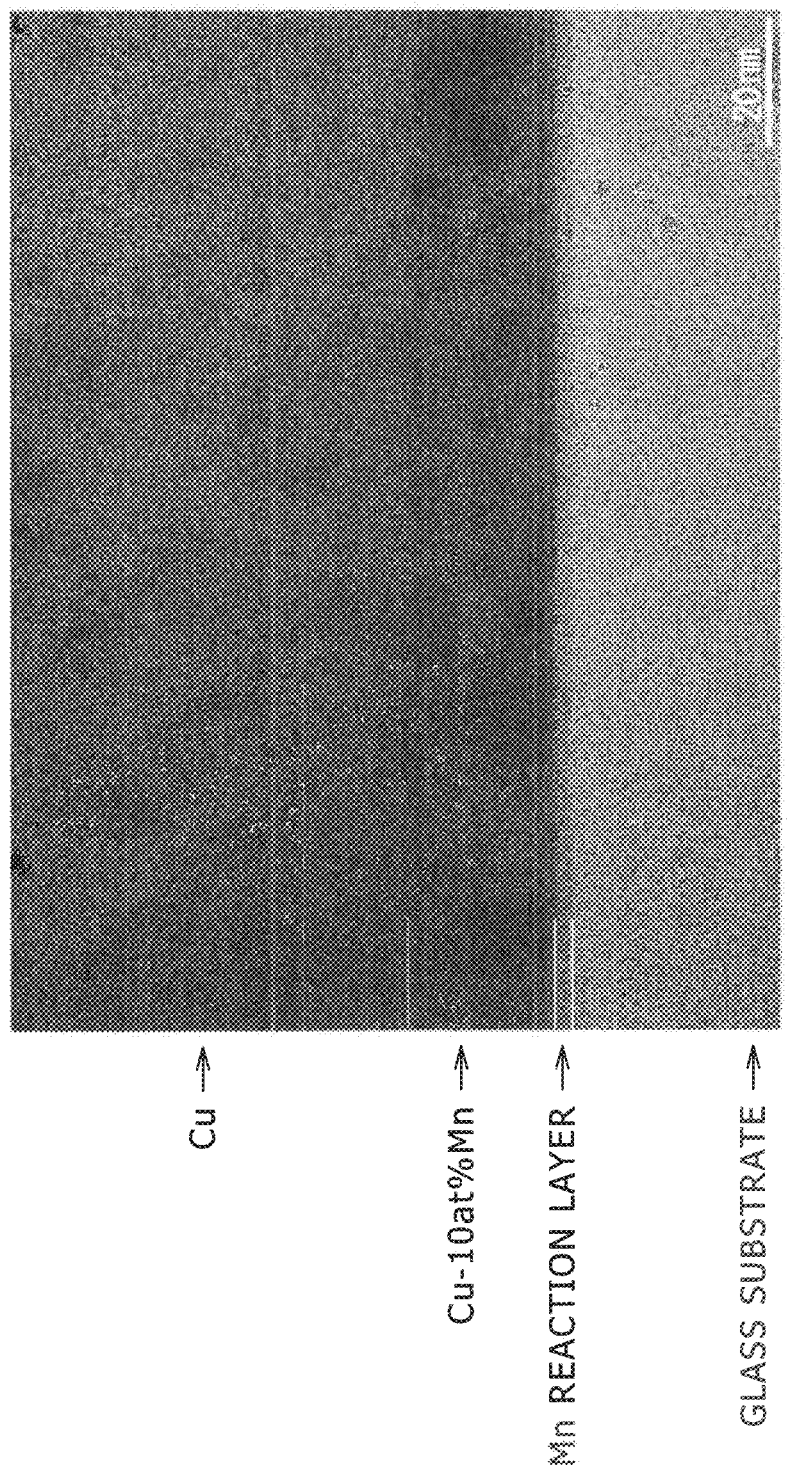
FIG. 15 is a TEM photograph showing a state of the interface between the first layer (Y) and a glass substrate according to an example of the invention.

FIG. 15 is a TEM photograph of the interface between the glass substrate and the first layer (Y) when the amount of Mn was 10 atom % and the thickness of the first layer (Y) was 20 nm. In FIG. 15, the Mn reaction layer was observed on the aforementioned interface. In addition, FIGS. 16(a) to 16(c) are graphs illustrating the results of analyzing the concentration profile in the depth direction of the film by using a TEM-EDX: and FIG. 16(a) illustrates the result of analyzing the concentration profile in the depth direction of the film when the first layer (Y) was composed of Cu-4Mn, the thickness thereof was 300 nm, and the second layer (X) was not present; FIG. 16(b) illustrates the result of analyzing the concentration profile in the depth direction of the film when the first layer (Y) was composed of Cu-4Mn, the thickness thereof was 50 nm, the second layer (X) was composed of pure Cu, and the thickness thereof was 500 nm (heat treatment was performed at 320° C. for 5 minutes); and FIG. 16(c) illustrates the result of analyzing the concentration profile in the depth direction of the film when the first layer (Y) was composed of Cu-4Mn, the thickness thereof was 20 nm, the second layer (X) was composed of pure Cu, and the thickness thereof was 500 nm (heat treatment was performed at 320° C. for 5 minutes). According to FIGS. 16(a) to 16(c), it is found that, in FIGS. 16(a) and 16(b) in each of which the relational expression of $T_M \geq 230\ M^{-1.2}$ was satisfied, high levels of Mn, Si, and O were detected near the interface with the glass, whereas in FIG. 16(c) in which the aforementioned relational expression was not satisfied, Mn was hardly detected neat the interface with the glass.

(2) Measurement of Electrical Resistance

Electrical resistance was measured by using the same samples as those for the aforementioned evaluation of adhesiveness, in the same way as Example 1. Electrical resistivity was determined by conversing the sheet resistance of a Cu alloy film, which has been measured by a direct current four-probe measurement method. As a result, it was found that, every electrical resistivity in the present Example 3 was low, which was within a practicable range.

Example 4

In the present example, wet etching property of the sample produced as follows was investigated. In a sample having a multilayer structure, etching rate of each of the lower layer and upper layer is normally different from each other, and hence, when the etching rate of the lower layer is larger than that of the upper layer, an undercut is generated in the bottom of the wiring. Accordingly, in the present example, wet etching property will be evaluated by an amount of undercut.

Multilayer films each having the first layer (Y) and the second layer (X) were first formed on glass substrates in the same way as Example 3, except that the Cu alloy films each including the first layer (Y) composed of a Cu alloy containing various elements shown in Table 3 and the second layer (X) composed of pure Cu were formed such that each of the first layers (Y) and the second layers (X) had the thickness shown in Table 3.

After the Cu alloy film of each of the aforementioned samples was processed into a pattern having a line & space pattern with a line width of it was etched with a mixed acid etchant (volume ratio of phosphoric acid:nitric acid:water=75:5:20). The wiring section of the etched sample was observed by a scanning electron microscope (SEM) to measure an amount of undercut. As a result, it was found that the amount of undercut in every sample shown in Table 3 was less than or equal to 0.5 μm, thereby allowing for good wet etching property to be achieved. Further, it was confirmed by the observation with the use of an optical microscope (magnification: 400 times) that no residue was generated in the etching portion in every sample.

TABLE 3

| | Thin film structure ※ Number in parenthesis represents film thickness | |
|---|---|---|
| No. | Second layer (X) | First layer (Y) |
| 1 | Pure Cu (250 nm) | Cu-10 at % Ni alloy (50 nm) |
| 2 | Pure Cu (250 nm) | Cu-10 at % Al alloy (50 nm) |
| 3 | Pure Cu (250 nm) | Cu-10 at % Mn alloy (50 nm) |
| 4 | Pure Cu (250 nm) | Cu-10 at % Ca alloy (50 nm) |
| 5 | Pure Cu (250 nm) | Cu-10 at % W alloy (50 nm) |
| 6 | Pure Cu (250 nm) | Cu-10 at % Nb alloy (50 nm) |
| 7 | Pure Cu (280 nm) | Cu-10 at % Al alloy (20 nm) |
| 8 | Pure Cu (200 nm) | Cu-10 at % Al alloy (100 nm) |
| 9 | Pure Cu (100 nm) | Cu-10 at % Al alloy (200 nm) |
| 10 | Pure Cu (250 nm) | Cu-1 at % Zn alloy (50 nm) |
| 11 | Pure Cu (250 nm) | Cu-2 at % Zn alloy (50 nm) |
| 12 | Pure Cu (250 nm) | Cu-5 at % Zn alloy (50 nm) |
| 13 | Pure Cu (290 nm) | Cu-4 at % Zn alloy (10 nm) |
| 14 | Pure Cu (280 nm) | Cu-4 at % Zn alloy (20 nm) |
| 15 | Pure Cu (250 nm) | Cu-4 at % Zn alloy (50 nm) |
| 16 | Pure Cu (200 nm) | Cu-10 at % Zn alloy (100 nm) |

Example 5

In the present example, the adhesiveness and electrical resistivity of each of the samples produced by using Zn as an alloy element in the Cu alloy and produced as follows, were studied immediately after the film had been formed and after a heat treatment had been performed at 350° C. for 30 minutes in vacuum atmosphere after the formation of the film.

In the present example, a sample was used in which a single Cu—Zn alloy film having a thickness of 300 nm had been formed as a Cu alloy film. Although the Cu alloy film in the present invention has the multilayer structure including the first layer (Y) and the second layer (X), it is effective to study the adhesiveness to a glass substrate and the electrical resistivity of a Cu alloy film including a single layer structure by which the composition of the Cu alloy in the first layer (Y) is assumed, in order to confirm an effect of enhancing the adhesiveness by an alloy element in the first layer (Y) in the multilayer structure and the tendency of the electrical resistivity of the Cu alloy film in the multilayer structure.

Each sample was produced by using pure Cu as a sputtering target and chipping on a pure metal tip made of Zn thereon and by forming a Cu—Zn single alloy film having a desired composition and a thickness of 300 nm. For comparison, a sample was also produced in which a pure Cu alloy film had been formed by using a pure Cu sputtering target. Other conditions for producing the samples were the same as those in Example 1.

The adhesiveness to a glass substrate and the electrical resistivity of the Cu alloy film of the samples produced as stated above were measured.

The adhesiveness to the glass substrate was measured immediately after the film had been formed and after a heat treatment had been performed at 350° C. for 30 minutes in vacuum atmosphere after the formation of the film. The adhesiveness was measured in the same way as Example 1, except that the tape was peeled off at an angle of 90°.

The electrical resistivity was measured immediately after the pattern for evaluating electrical resistance had been formed in the same way as Example 1 and after a heat treatment had been performed at each temperature of 350° C., 400° C., and 450° C. for 30 minutes.

Figure 17:
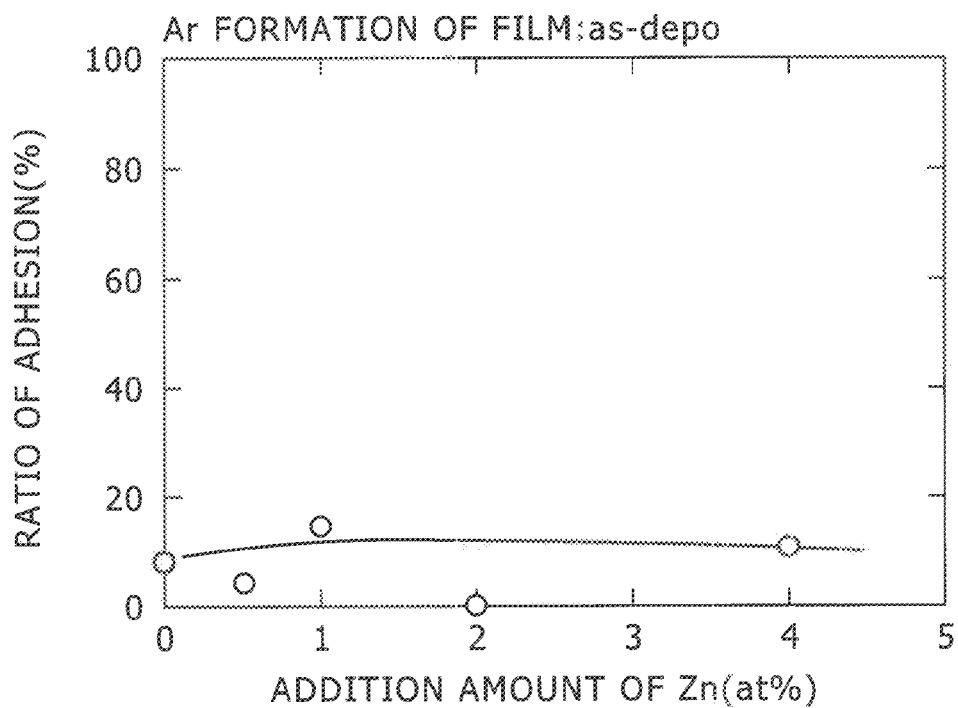
FIG. 17 is a graph illustrating the relationship between the content of an alloy element (Zn) and the adhesiveness immediately after the film has been formed in Example 5.
Figure 18:
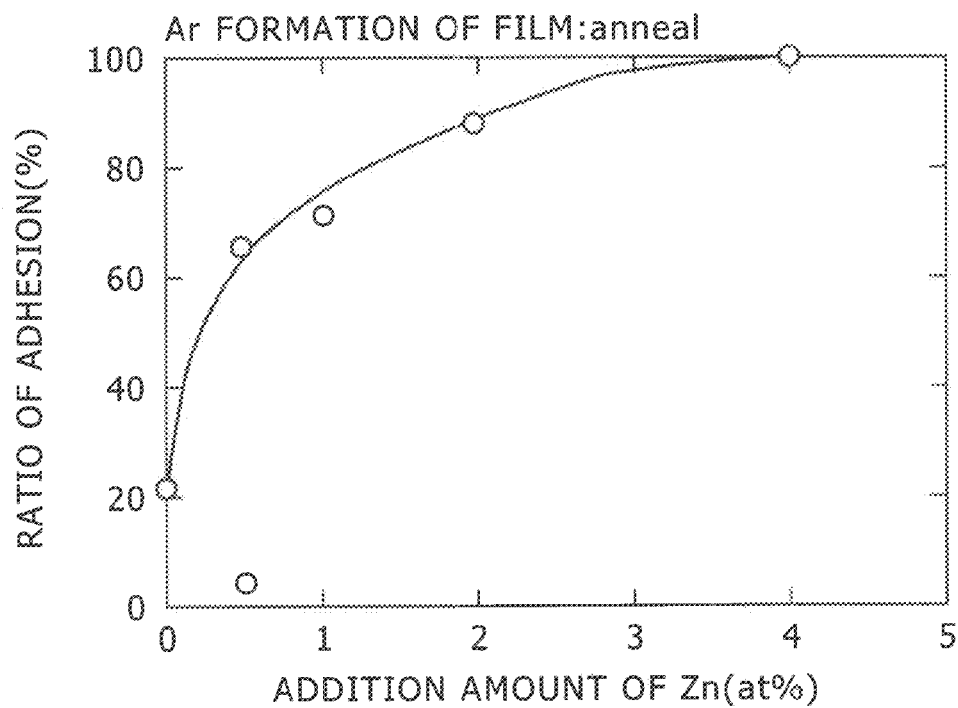
FIG. 18 is a graph illustrating the relationship between the content of the alloy element (Zn) and the adhesiveness after the heat treatment in Example 5.
Figure 19:
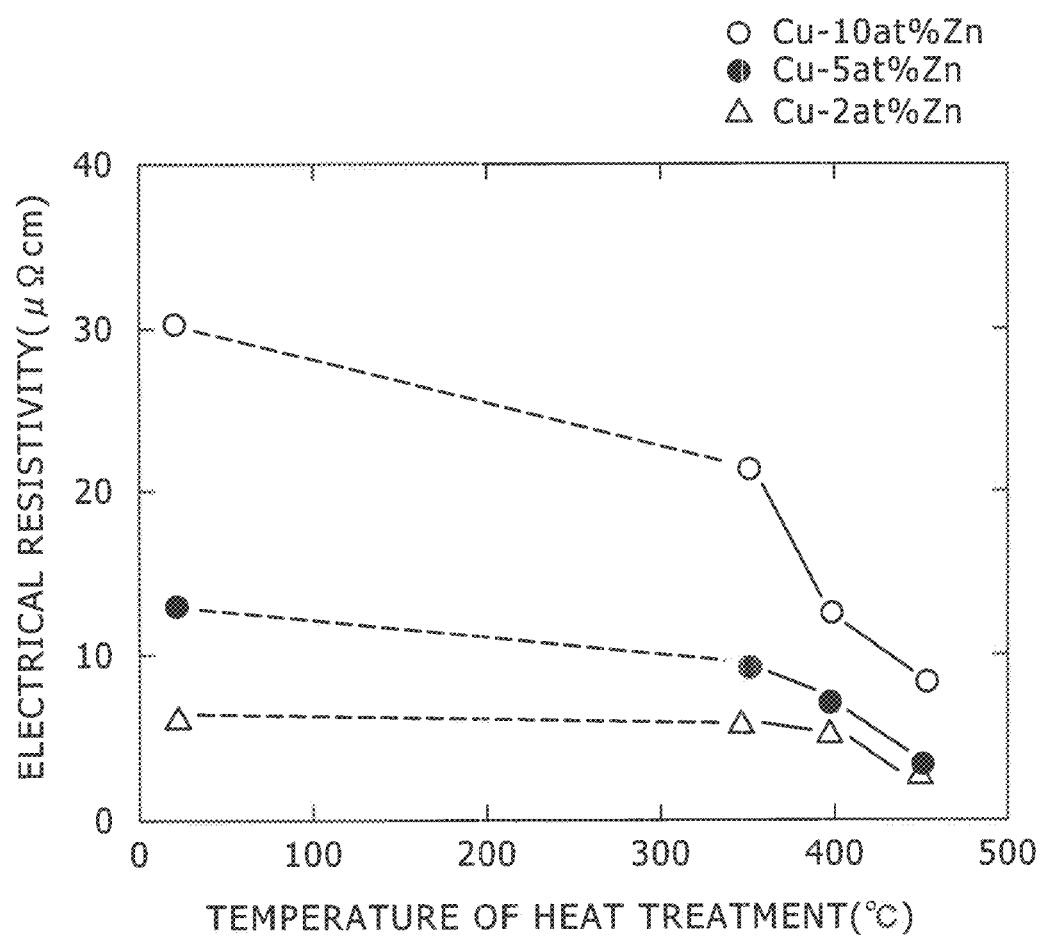
FIG. 19 is a graph illustrating the relationship among the content of the alloy element (Zn), heat treatment temperature, and an electrical resistivity in Example 5.

The results of the adhesiveness are shown in FIGS. 17 and 18, and that of the electrical resistivity are shown in FIG. 19.

It was found from FIGS. 17 and 18 that the adhesiveness was enhanced by performing a heat treatment after the formation of the film. It was also found that the adhesiveness as high as 80% or more can be achieved after the heat treatment by containing approximately 2 atom % or more of Zn.

It is found from FIG. 19 that, although the electrical resistivity of the Cu alloy film is increased with an increase in the addition amount of Zn, a low electrical resistivity sufficiently available in practical use can be achieved by performing a hear treatment.

From the results of FIGS. 17 to 19, it is made clear that, although the adhesiveness is enhanced with an increase in the amount of alloy elements in the Cu alloy film, the electrical resistivity is increased; however, both the aforementioned enhancement of the adhesiveness and reduction of the electrical resistivity can be satisfied by making the Cu alloy film have the multilayer structure including an under layer composed of a Cu alloy layer in which a predetermined amount or more alloy elements have been added and an upper layer composed of pure Cu, etc. Further, the balance between the adhesiveness and the electrical resistivity can be controlled by adjusting the thickness of the Cu alloy lower layer.

Although the present application has been described in detail and with reference to particular embodiments, it is apparent to a person skilled in the art that various modifications and alterations can be made without departing from the spirit and scope of the present invention.

The present application is based on Japanese Patent Application No. 2009-008264 filed on Jan. 16, 2009, Japanese Patent Application No. 2009-174690 filed on Jul. 27, 2009, and Japanese Patent Application No. 2009-278377 filed on Dec. 8, 2009, the entire contents of which are incorporated herein by reference.

INDUSTRIAL APPLICABILITY

A display device according to the present invention is provided with a Cu alloy film (wiring film) having the multilayer structure, which includes a first layer (Y) composed of a Cu alloy containing predetermined elements excellent in the adhesiveness to a transparent substrate and a second layer (X) composed of pure Cu or a Cu alloy having an electrical resistivity lower than that of the first layer (Y), and hence both the high adhesiveness to the transparent substrate and a low electrical resistivity as the whole Cu alloy film can be achieved. With respect to the adhesiveness, still better adhesiveness can be achieved by appropriately controlling the thickness of the first layer (Y) and the content of Mn in the first layer (Y), in addition to the fact that the alloy element in the first layer (Y) is particularly made to be Mn. Further, in particular, the Cu alloy film employed in the present invention is extremely excellent in the resistance for the migration of sodium ion, etc., (migration resistance), which may occur when an inexpensive soda-lime glass substrate is used, and hence the Cu alloy film can be used in an extremely suitable manner as a wiring material for the display device provided with a soda-lime glass substrate. Furthermore, the Cu alloy film employed in the invention has the multilayer structure including similar pure Cu or Cu alloys, which does not cause an extreme difference in the etching rate between them, and hence fine-processing excellent in forming a shape, by which a patter can be easily formed, can be performed by using the aforementioned Cu alloy film.

REFERENCE NUMERALS

| | |
|---|---|
| 1a | GLASS SUBSTRATE |
| 5 | TRANSPARENT CONDUCTIVE FILM (PIXEL ELECTRODE, ITO FILM) |
| 25 | SCANNING LINE |
| 26 | GATE WIRING (GATE ELECTRODE) |
| 27 | GATE INSULATING FILM |
| 28 | SOURCE WIRING (SAUCE ELECTRODE) |
| 29 | DRAIN WIRING (DRAIN ELECTRODE) |
| 30 | SILICON NITRIDE FILM (PROTECTIVE FILM) |
| 31 | PHOTORESIST |
| 32 | CONTACT HOLE |
| (X) | SECOND LAYER |
| (Y) | FIRST LAYER |

The invention claimed is:
1. A display device comprising:
a Cu alloy film for the display device that is formed on a transparent substrate and is directly brought into contact with the transparent substrate, wherein
the Cu alloy film has a multilayer structure,
wherein the multilayer structure includes a first layer (Y) comprising a Cu alloy containing, in total, 2-20 atom % of at least one element selected from the group consisting of Zn, Ni, Ti, W, Nb, and Mn, and a second layer (X) comprising pure Cu or a Cu alloy having a content of Cu more than or equal to 90 atom % and having an electrical resistivity lower than that of the first layer (Y), and
wherein the first layer (Y) is brought into contact with the transparent substrate.

2. The display device according to claim 1, wherein
the thickness of the first layer (Y) is more than or equal to 10 nm and less than or equal to 100 nm, and
the thickness of the first layer (Y) is less than or equal to 60% of the total thickness of the Cu alloy film.

3. The display device according to claim 2, wherein
the thickness of the first layer (Y) is more than or equal to 20 nm and less than or equal to 100 nm, and
the thickness of the first layer (Y) is less than or equal to 50% of the total thickness of the Cu alloy film.

4. The display device according to claim 1, wherein
the first layer (Y) contains at least Mn and the thickness of the first layer (Y) is more than or equal to 10 nm and less than or equal to 100 nm.

5. The display device according to claim 1, wherein
the first layer (Y) contains at least Zn or Ni and the thickness of the first layer (Y) is more than or equal to 20 nm and less than or equal to 100 nm.

6. The display device according to claim 1, wherein
the first layer (Y) contains at least Mn and the thickness $T_M$ (nm) of the first layer (Y) and the content M (atom %) of Mn satisfy the relationship of $T_M \geq 230\, M^{-1.2}$.

7. The display device according to claim 1, wherein
the Cu alloy film is subjected to a heat treatment at 250° C. or higher for 5 minutes or longer.

8. The display device according to claim 1, wherein
the material of the transparent substrate is soda-lime glass.

9. The display device according to claim 1, wherein the first layer (Y) of the Cu alloy film contains Mn or Ni, the Cu alloy film is subjected to a heat treatment at 250° C. or higher for 5 minutes or longer, and Mn or Ni inside the first layer (Y) migrates toward the interface of the first layer (Y) with the transparent substrate during heat treatment.

10. The display device according to claim 1, wherein
the Cu alloy of the first layer (Y) further contains 0.02 to 1.0 atom % of at least one element selected from the group consisting of Fe and Co.

11. The display device according to claim 1, wherein
the first layer (Y) contains both Mn and Zn or both Mn and Ni, and the thickness of the first layer (Y) is more than or equal to 20 nm and less than or equal to 100 nm.

12. The display device according to claim 1, wherein
a first layer (Y) etching rate is similar to, or lower than, a second layer (X) etching rate.

13. The display device according to claim 1, wherein
the first layer (Y) contains Ni and the thickness of the first layer (Y) is more than or equal to 20 nm and less than or equal to 100 nm.

* * * * *